(12) United States Patent
Kirner

(10) Patent No.: US 11,495,704 B2
(45) Date of Patent: Nov. 8, 2022

(54) MULTIJUNCTION PHOTOVOLTAIC DEVICE

(71) Applicant: OXFORD PHOTOVOLTAICS LIMITED, Yarnton (GB)

(72) Inventor: Simon Kirner, Oxfordshire (GB)

(73) Assignee: Oxford Photovoltaics Limited, Yarnton (GB)

( * ) Notice: Subject to any disclaimer, the term of this patent is extended or adjusted under 35 U.S.C. 154(b) by 0 days.

(21) Appl. No.: 16/487,159

(22) PCT Filed: Feb. 20, 2018

(86) PCT No.: PCT/GB2018/050443
§ 371 (c)(1),
(2) Date: Aug. 20, 2019

(87) PCT Pub. No.: WO2018/150203
PCT Pub. Date: Aug. 23, 2018

(65) Prior Publication Data
US 2020/0058819 A1    Feb. 20, 2020

(30) Foreign Application Priority Data

Feb. 20, 2017  (GB) ..................... 1702720

(51) Int. Cl.
*H01L 31/0725* (2012.01)
*H01L 27/30* (2006.01)
(Continued)

(52) U.S. Cl.
CPC ........ *H01L 31/0725* (2013.01); *H01L 27/302* (2013.01); *H01L 31/02008* (2013.01);
(Continued)

(58) Field of Classification Search
CPC ............... H01L 31/0725; H01L 27/302; H01L 31/02008; H01L 31/022466; H01L 31/028;
(Continued)

(56) References Cited

U.S. PATENT DOCUMENTS

2005/0126628 A1* 6/2005 Scher .................... B82Y 10/00
                                                        136/263
2012/0132930 A1* 5/2012 Young .................. H05K 1/0274
                                                        257/84
(Continued)

FOREIGN PATENT DOCUMENTS

CN    102983217 A    3/2013
CN    106025087 A    10/2016
(Continued)

OTHER PUBLICATIONS

Colin D. Bailie "Semi-transparent perovskite solar cells for tandems with silicon and CIGS" Energy Environ. Sci., 2015, 8, 956-963 (Year: 2015).*
(Continued)

*Primary Examiner* — Michael Y Sun
(74) *Attorney, Agent, or Firm* — Meunier Carlin & Curfman LLC

(57) ABSTRACT

There is provided a multi junction photovoltaic device comprising a first sub-cell comprising a photoactive region comprising a layer of perovskite material, a second sub-cell comprising a photoactive silicon absorber. and an intermediate region disposed between and connecting the first sub-cell and the second sub-cell. The intermediate region comprises an interconnect layer, the interconnect layer comprising a two-phase material comprising elongate (i.e. filament like) silicon nanocrystals embedded in a silicon oxide matrix.

17 Claims, 10 Drawing Sheets

(51) Int. Cl.
H01L 31/02 (2006.01)
H01L 31/0224 (2006.01)
H01L 31/028 (2006.01)
H01L 51/42 (2006.01)
H01L 31/0352 (2006.01)
H01L 31/043 (2014.01)
H01L 31/0687 (2012.01)

(52) U.S. Cl.
CPC .... H01L 31/028 (2013.01); H01L 31/022466 (2013.01); H01L 51/4246 (2013.01); H01L 31/0352 (2013.01); H01L 31/043 (2014.12); H01L 31/0687 (2013.01); Y02E 10/547 (2013.01); Y02E 10/549 (2013.01)

(58) Field of Classification Search
CPC ............... H01L 51/4246; H01L 31/043; H01L 31/0687; H01L 31/0352; Y02E 10/549; Y02E 10/544; Y02E 10/547
See application file for complete search history.

(56) References Cited

U.S. PATENT DOCUMENTS

| | | | |
|---|---|---|---|
| 2013/0327384 A1 | 12/2013 | Endo et al. | |
| 2014/0026948 A1* | 1/2014 | Ihn | B82Y 10/00 136/255 |
| 2015/0162556 A1 | 6/2015 | Friend et al. | |
| 2015/0249170 A1 | 9/2015 | Snaith et al. | |
| 2015/0303332 A1* | 10/2015 | Chang | H01G 9/2031 136/256 |
| 2016/0005987 A1* | 1/2016 | Koposov | H01L 51/4226 136/263 |
| 2016/0029482 A1 | 1/2016 | Young et al. | |
| 2016/0079552 A1* | 3/2016 | Su | H01L 51/0032 136/260 |
| 2016/0190377 A1 | 6/2016 | Green | |

FOREIGN PATENT DOCUMENTS

| | | |
|---|---|---|
| JP | 5197845 B2 | 5/2013 |
| JP | 2015046584 A | 3/2015 |
| KR | 20130095914 | 8/2013 |
| WO | 2013/171517 | 11/2013 |
| WO | 2014/045021 | 3/2014 |
| WO | 2015/017885 | 2/2015 |
| WO | 2016/198898 | 12/2016 |

OTHER PUBLICATIONS

S. Gardelis "Structural and optical characterization of two-dimensional arrays of Si nanocrystals embedded in SiO2 for photovoltaic applications" Journal of Applied Physics 111, 083536 (2012) (Year: 2012).*

X.J. Hao "Effects of phosphorus doping on structural and optical properties of silicon nanocrystals in a SiO2 matrix" Thin Solid Films 517 (2009) 5646-5652 (Year: 2009).*

Thomas Grundler "N-type hydrogenated amorphous silicon oxide containing a microcrystalline silicon phase as an intermediate reflector in silicon" Phys. Status Solidi C 7, No. 3-4, 1085-1088 (2010) (Year: 2010).*

Thomas Mueller, "Application of Wide-Bandgap Hydrogenated Amorphous Silicon Oxide Layers to Heterojunction Solar Cells for High Quality Passivation" 2008 33rd IEEE Photovoltaic Specialists Conference, 2009 (Year: 2009).*

Xiaodong Pi "Doping Silicon Nanocrystals with Boron and Phosphorus"Journal of Nanomaterials vol. 2012, Article ID 912903 (Year: 2012).*

Miha Filipič "CH3NH3PbI3 perovskite / silicon tandem solar cells: characterization based optical simulations" Optics Express Apr. 2015 | vol. 23, No. 7 (Year: 2015).*

International Search Report and Written Opinion dated May 15, 2018, from International Application No. PCT/GB2018/050443, 12 pages.

Kojima, A. et al. "Organometal Halide Perovskites as Visible-Light Sensitizers for Photovoltaic Cells", J. Am. Chem. Soc., 131(17), pp. 6050-6051 (2009).

Lee, M. et al. "Efficient Hybrid Solar Cells Based on Meso-Superstructured Organometal Halide Perovskites", Science, 338(6107), pp. 643-647 (2012).

Coutts, T. et al. "Modeled performance of polycrystalline thin film tandem solar cells", Progress in Photovoltaics: Research and Applications, 10(3), pp. 195-203 (2002).

Noh, J. et al. "Chemical Management for Colorful, Efficient, and Stable Inorganic-Organic Hybrid Nanostructured Solar Cells", Nano Letters, 2013.

Rouquerol, J. et al. "Recommendations for the characterization of porous solids", (Technical Report), Pure and Applied Chemistry, 66(8) (1994).

Haber, J. et al. "Manual on catalyst characterization" (Recommendations 1991). Pure and Applied Chemistry.) IUPAC documents (1991).

Mailoa, J.P. et al. "Optical Loss Analysis of Monolithic Perovskite/Si Tandem Solar Cell", IEEE, 2015.

Mailoa, J.P. et al. "A 2-terminal perovskite/silicon multijunction solar cell enabled by a silicon tunnel junction", AIP 106, 2015.

Schneider, B.W. et al. "Pyramidal surface textures for light trapping and antireflection in perovskiteon—silicon tandem solar cells", Optics Express, 22(S6), p. A1422 (2014).

Löper, P. et al. "Organicinorganic halide perovskite/crystalline silicon four-terminal tandem solar cells", Physical chemistry chemical physics: PCCP, 17, p. 1619 (2015).

Bailie, C. et al. "Semitransparent perovskite solar cells for tandems with silicon and CIGS", Energy Environ. Sci., pp. 1-28 (2015).

Filipic, M. et al. "CH3NH3PbI3 perovskite / silicon tandem solar cells:characterization based optical simulations", Optics Express, 23(7), pp. 480-484 (2015).

Examination Report in connection to EP Application No. 18 707 955.3, dated May 28, 2021.

Office Action issued for corresponding Japanese Patent Application No. 2019-544852, dated Mar. 1, 2022.

Office Action and Search report issued for Chinese Application No. 201880012397.2, dated Jun. 21, 2022.

Office Action issued for Korean Application No. 10-2019-7026285 dated Sep. 14, 2022. English Translation. 11 pages.

* cited by examiner

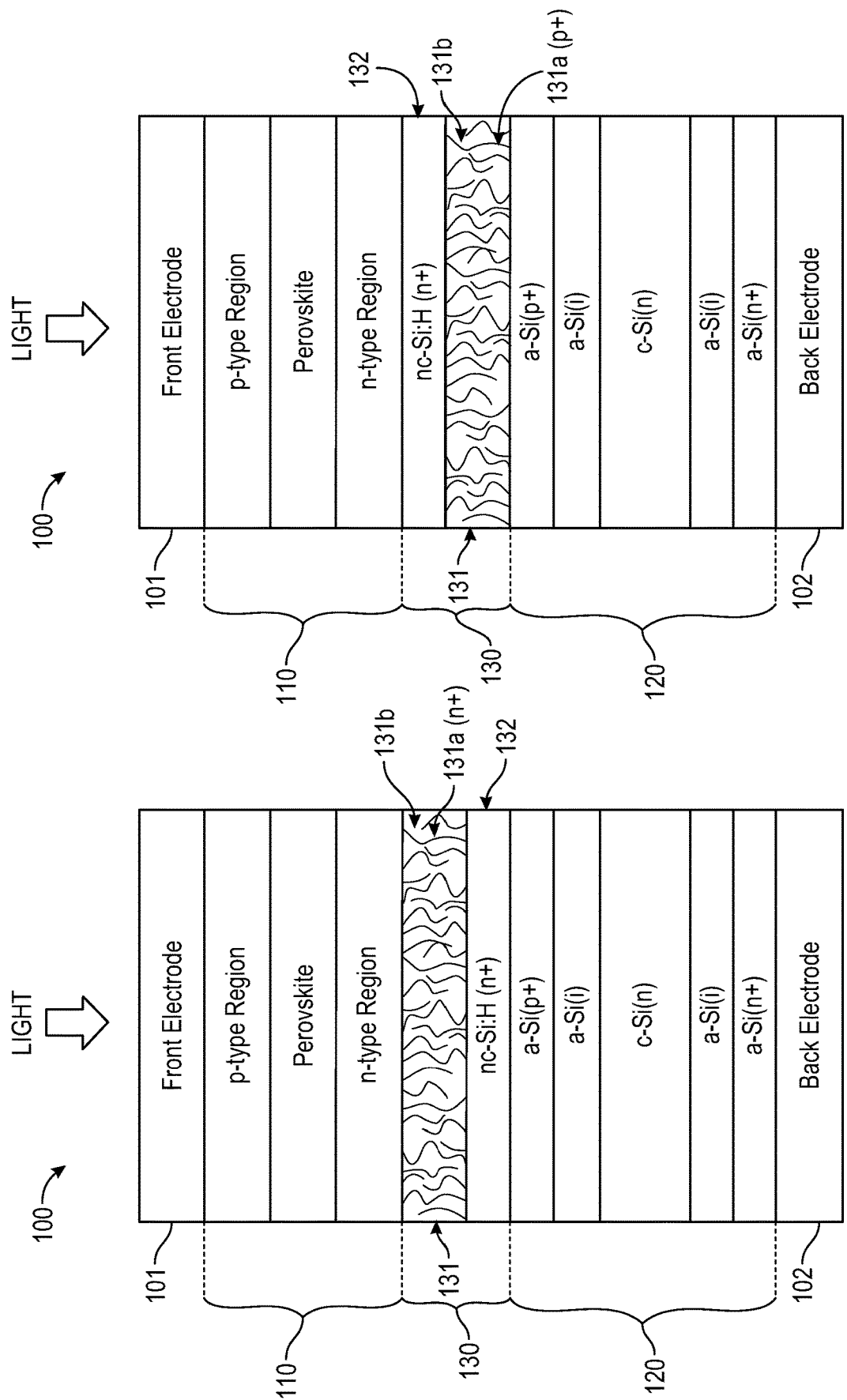

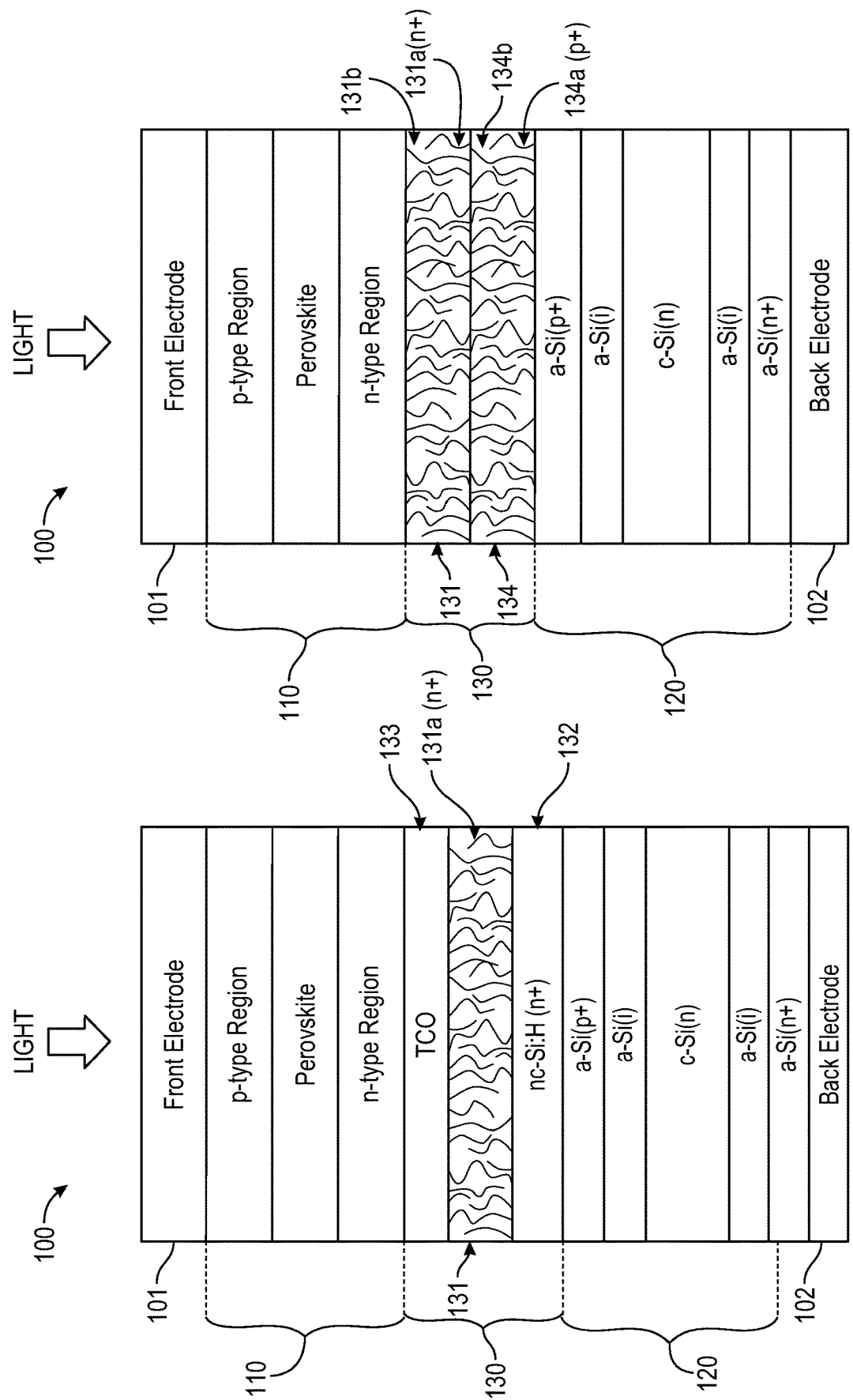

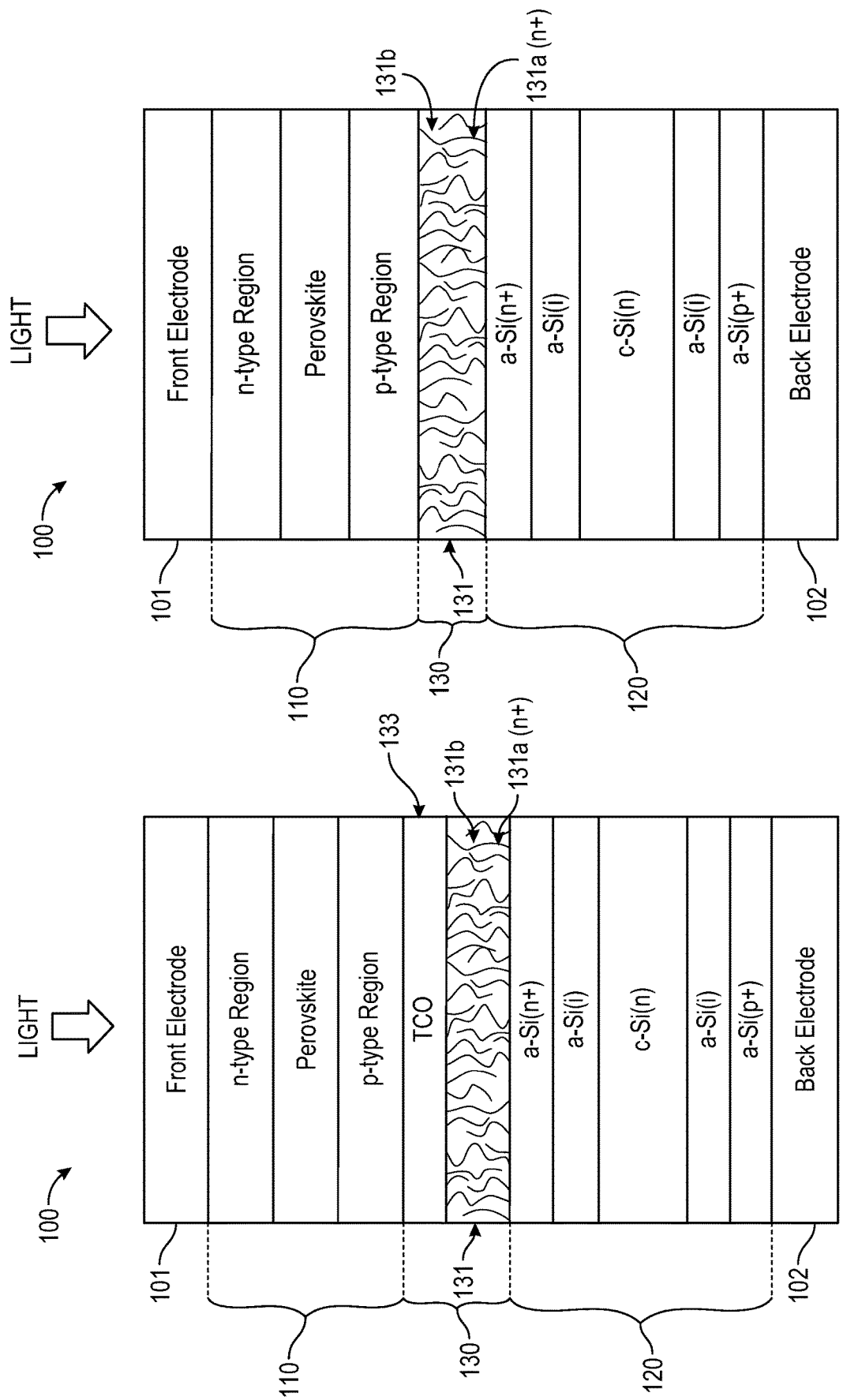

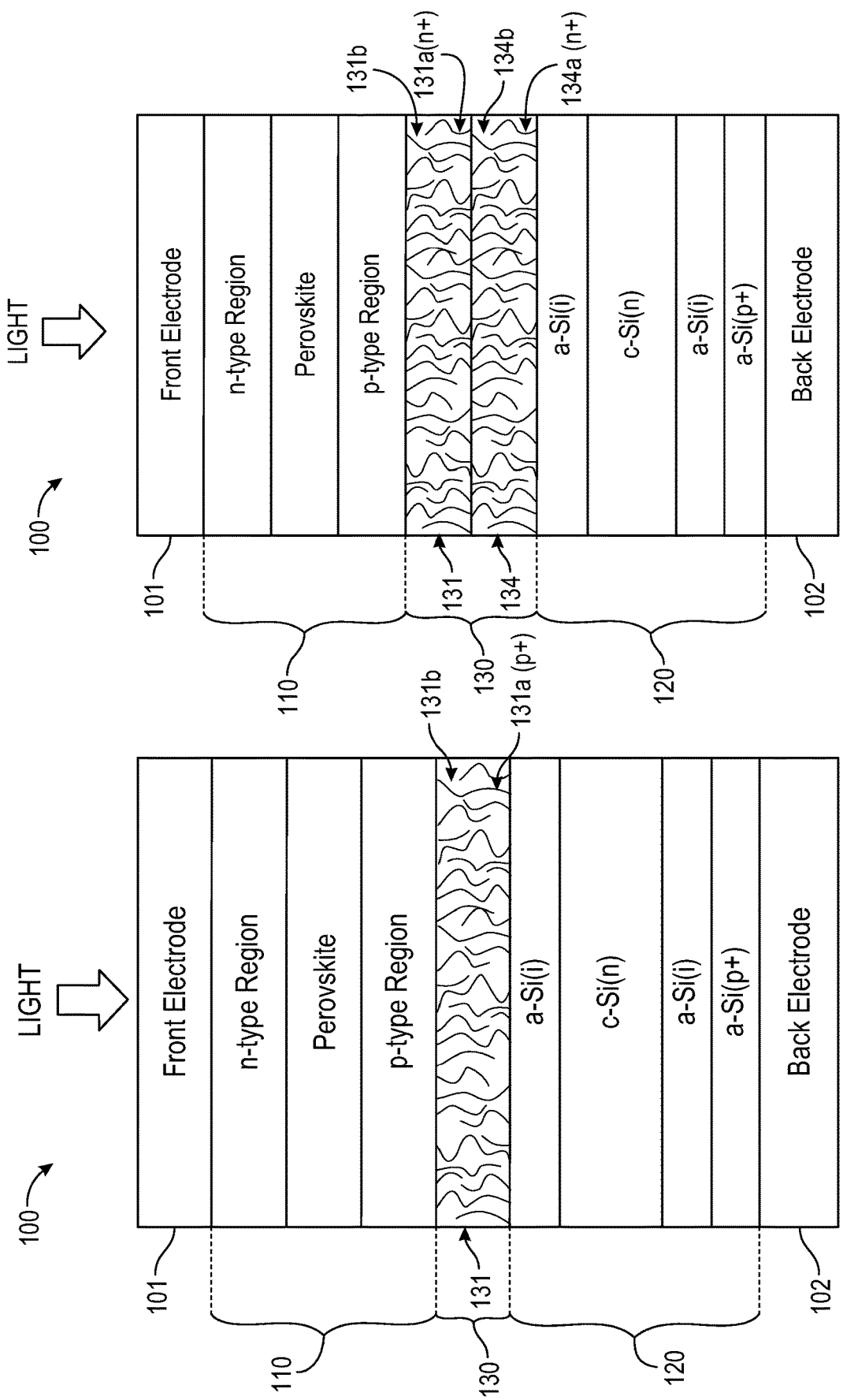

MULTIJUNCTION PHOTOVOLTAIC DEVICE

FIELD OF THE INVENTION

The present invention relates to a monolithically integrated perovskite-on-silicon multi-junction photovoltaic device.

BACKGROUND OF THE INVENTION

Over the past forty years or so there has been an increasing realisation of the need to replace fossil fuels with more secure sustainable energy sources. The new energy supply must also have low environmental impact, be highly efficient and be easy to use and cost effective to produce. To this end, solar energy is seen as one of the most promising technologies, nevertheless, the high cost of manufacturing devices that capture solar energy, including high material costs, has historically hindered its widespread use.

Every solid has its own characteristic energy-band structure which determines a wide range of electrical characteristics. Electrons are able to transition from one energy band to another, but each transition requires a specific minimum energy and the amount of energy required will be different for different materials. The electrons acquire the energy needed for the transition by absorbing either a phonon (heat) or a photon (light). The term "band gap" refers to the energy difference range in a solid where no electron states can exist, and generally means the energy difference (in electron volts) between the top of the valence band and the bottom of the conduction band. The efficiency of a material used in a photovoltaic device, such as a solar cell, under normal sunlight conditions is a function of the band gap for that material. If the band gap is too high, most daylight photons cannot be absorbed; if it is too low, then most photons have much more energy than necessary to excite electrons across the band gap, and the rest will be wasted. The Shockley-Queisser limit refers to the theoretical maximum amount of electrical energy that can be extracted per photon of incoming light and is about 1.34 eV. The focus of much of the recent work on photovoltaic devices has been the quest for materials which have a band gap as close as possible to this maximum.

One class of photovoltaic materials that has attracted significant interest has been the perovskites. Materials of this type form an $ABX_3$ crystal structure which has been found to show a favourable band gap, a high absorption coefficient and long diffusion lengths, making such compounds ideal as an absorber in photovoltaic devices. Early examples of the use of perovskite materials in photovoltaic application are reported by Kojima, A. et al., 2009. Organometal halide perovskites as visible-light sensitizers for photovoltaic cells. Journal of the American Chemical Society, 131(17), pp. 6050-1 in which hybrid organic-inorganic metal halide perovskites were used as the sensitizer in liquid electrolyte based photoelectrochemical cells. Kojima et al report that a highest obtained solar energy conversion efficiency (or power energy conversion efficiency, PCE) of 3.8%, although in this system the perovskite absorbers decayed rapidly and the cells dropped in performance after only 10 minutes.

Subsequently, Lee, M. M. et al., 2012. Efficient hybrid solar cells based on meso-superstructured organometal halide perovskites. Science (New York, N.Y.), 338(6107), pp. 643-7 reported a "meso-superstructured solar cell" in which the liquid electrolyte was replaced with a solid-state hole conductor (or hole-transporting material, HTM), spiro-MeOTAD. Lee et al reported a significant increase in the conversion efficiency achieved, whilst also achieving greatly improved cell stability as a result of avoiding the use of a liquid solvent. In the examples described, $CH_3NH_3PbI_3$ perovskite nanoparticles assume the role of the sensitizer within the photovoltaic cell, injecting electrons into a mesoscopic $TiO_2$ scaffold and holes into the solid-state HTM. Both the $TiO_2$ and the HTM act as selective contacts through which the charge carriers produced by photoexcitation of the perovskite nanoparticles are extracted.

Further work described in WO2013/171517 disclosed how the use of mixed-anion perovskites as a sensitizer/absorber in photovoltaic devices, instead of single-anion perovskites, results in more stable and highly efficient photovoltaic devices. In particular, this document discloses that the superior stability of the mixed-anion perovskites is highlighted by the finding that the devices exhibit negligible colour bleaching during the device fabrication process, whilst also exhibiting full sun power conversion efficiency of over 10%. In comparison, equivalent single-anion perovskites are relatively unstable, with bleaching occurring quickly when fabricating films from the single halide perovskites in ambient conditions.

More recently, WO2014/045021 described planar heterojunction (PHJ) photovoltaic devices comprising a thin film of a photoactive perovskite absorber disposed between n-type (electron transporting) and p-type (hole transporting) layers. Unexpectedly it was found that good device efficiencies could be obtained by using a compact (i.e. without effective/open porosity) thin film of the photoactive perovskite, as opposed to the requirement of a mesoporous composite, demonstrating that perovskite absorbers can function at high efficiencies in simplified device architectures.

Recently some of research into the application of perovskites in photovoltaic devices has focussed on the potential of these materials to boost the performance of conventional silicon-based solar cells by combining them with a perovskite-based cell in a tandem/multi-junction arrangement. In this regard, a multi-junction photovoltaic device comprises multiple separate sub-cells (i.e. each with their own photoactive region) that are "stacked" on top of each other and that together convert more of the solar spectrum into electricity thereby increasing the overall efficiency of the device. To do so, each photoactive region of each sub-cell is selected so that the band gap of the photoactive region ensures that it will efficiently absorbs photons from a specific segment of the solar spectrum. This has two important advantages over conventional single-junction photovoltaic devices. Firstly the combination of multiple sub-cells/photoactive regions with different band gaps ensures that a wider range of incident photons can be absorbed by a multi-junction device, and secondly each sub-cell/photoactive region will be more effective at extracting energy from the photons within the relevant part of the spectrum. In particular, the lowest band gap of a multi-junction photovoltaic device will be lower than that of a typical single junction device, such that a multi-junction device will be able to absorb photons that possess less energy than those that can be absorbed by a single junction device. Furthermore, for those photons that would be absorbed by both a multi-junction device and a single junction device, the multi-junction device will absorb those photons more efficiently, as having band gaps closer to the photon energy reduces thermalization losses.

In a multi-junction device, the top sub-cell/photoactive region in the stack has the highest band gap, with the band gap of the lower sub-cells/photoactive regions reducing towards the bottom of the device. This arrangement maximizes photon energy extraction as the top sub-cell/photoactive region absorbs the highest energy photons whilst allowing the transmission of photons with less energy. Each subsequent sub-cell/photoactive region then extracts energy from photons closest to its band gap thereby minimizing thermalization losses. The bottom sub-cell/photoactive region then absorbs all remaining photons with energy above its band gap. When designing multi-junction cells it is therefore important to choose sub-cells whose photoactive regions with the right bandgaps in order to optimise harvesting of the solar spectrum. In this regard, for a tandem photovoltaic device that comprises two sub-cells/photoactive regions, a top sub-cell/photoactive region and a bottom sub-cell/photoactive region, it has been shown that the bottom sub-cell/photoactive region should ideally have a band gap of around 1.1 eV whilst the top sub-cell/photoactive region should ideally have a band gap of around 1.7 eV (Coutts, T. J., Emery, K. a. & Scott Ward, J., 2002. Modeled performance of polycrystalline thin-film tandem solar cells. Progress in Photovoltaics: Research and Applications, 10(3), pp. 195-203).

Consequently, there has been interest in developing hybrid organic-inorganic perovskite solar cells for use in tandem photovoltaic devices given that the band gap of these perovskite materials can be tuned from around 1.5 eV to over 2 eV by varying the halide composition of organometal halide perovskites (Noh, J. H. et al., 2013. Chemical Management for Colourful, Efficient, and Stable Inorganic-Organic Hybrid Nanostructured Solar Cells. Nano letters, 2, pp. 28-31).

In this regard, Schneider, B. W. et al (Schneider, B. W. et al., 2014. Pyramidal surface textures for light trapping and antireflection in perovskite-on-silicon tandem solar cells. Optics Express, 22(S6), p. A1422) reported on the modelling of a perovskite-on-silicon tandem cell in which the modelled cell has a 4-terminal, mechanically stacked structure. Löper, P. et al (Löper, P. et al., 2015. Organic-inorganic halide perovskite/crystalline silicon four-terminal tandem solar cells. Physical chemistry chemical physics: PCCP, 17, p. 1619) reported on the implementation of a four-terminal tandem solar cell consisting of a methyl ammonium lead triiodide ($CH_3NH_3PbI_3$) (i.e. organometal halide perovskite) top sub-cell mechanically stacked on a crystalline silicon heterojunction bottom sub-cell. Similarly, Bailie, C. et al. (Bailie, C. et al., 2015. Semi-transparent perovskite solar cells for tandems with silicon and CIGS. Energy Environ. Sci., pp. 1-28) reported on a mechanically-stacked tandem solar cell consisting of a methyl ammonium lead triiodide ($CH_3NH_3PbI_3$) top sub-cell on a copper indium gallium diselenide (CIGS) or low-quality multi-crystalline silicon bottom sub-cell. Filipic, M. et al. (Filipic, M. et al., 2015. $CH_3NH_3PbI_3$ perovskite/silicon tandem solar cells: characterization based optical simulations. Optics Express, 23(7), pp. 480-484) reported on the simulation of both mechanically stacked (four terminal) and monolithically integrated (two terminal) tandem devices consisting of a methyl ammonium lead triiodide ($CH_3NH_3PbI_3$) top sub-cell and a crystalline silicon bottom sub-cell. Mailoa, J. P. et al. (Mailoa, J. P. et al., 2015. A 2-terminal perovskite/silicon multi-junction solar cell enabled by a silicon tunnel junction. Applied Physics Letters, 106(12), p. 121105) then reported on the fabrication of a monolithic tandem solar cell consisting of a methyl ammonium lead triiodide ($CH_3NH_3PbI_3$) top sub-cell and a crystalline silicon bottom sub-cell.

In a mechanically stacked multi-junction photovoltaic device the individual sub-cells are stacked on top of each other and are each provided with their own separate electrical contacts, such that the individual sub-cells are connected in parallel and do not require current matching. This contrasts with a monolithically integrated multi-junction photovoltaic device in which the individual sub-cells are electrically connected in series between a single pair of terminals, which results in the need for a recombination layer or a tunnel junction and current matching between adjacent sub-cells. Whilst a mechanically stacked multi-junction photovoltaic device does not require current matching between the sub-cells, the additional size and cost of the additional contacts and substrates, and a lower practical efficiency limit, make mechanically stacked structures less favourable than monolithically integrated structures.

Currently, typical metal halide perovskite/silicon tandem solar cells incorporate transparent conductive oxide (TCO) layers on top of the silicon bottom sub-cell that are necessary to form a low ohmic tunnel recombination contact between the silicon sub-cell and the perovskite sub-cell. By way of example, FIG. 1 illustrates schematically a conventional monolithically integrated multi-junction photovoltaic device that comprises a top perovskite based sub-cell, a bottom silicon based sub-cell, and a TCO interconnect layer comprising indium tin oxide (ITO). While this configuration is electronically favourable, it induces two problems.

Firstly, the high lateral conductivity of the ITO layer (specific conductivity $>2\times10^2$ S/cm) makes potential shunt paths existing in the absorber layer highly detrimental for the complete photovoltaic device, because they can short large fractions of the device. FIG. 2 shows the dark and light current-voltage (IV) characteristics of two representative perovskite/silicon tandem cells with a 50 nm (well conducting) and a 10 nm thin (less conducting) ITO layer. Both cells were fabricated with standard pyramidal textured c-Si wafers and suffer from a lower than expected open-circuit voltage and fill factor. Both of these are presumably caused by shunt paths through the perovskite absorbers. As mentioned above, these are particularly detrimental if they are well connected to the rest of the device. This explains the large difference in the IV-curves between the two ITO thicknesses, because the thinner ITO layer has a significantly higher sheet resistance than the thicker one.

The second problem induced by the ITO layer is that it forms a highly reflective interface, because of the unfavourable order of refractive indices, which is schematically shown in FIG. 3. Whilst it is typically the case that further functional layers are present in between the perovskite and silicon absorber layers and the TCO, these are not shown in FIG. 3 as their influence on the light propagation is insignificant due to their low optical thickness.

SUMMARY OF THE PRESENT INVENTION

To reduce the detrimental influence of local shunt paths, the present inventors have developed a monolithically integrated perovskite-on-silicon multi-junction photovoltaic device that comprises an interconnect layer, disposed between the perovskite sub-cell and the silicon sub-cell, which has a very low lateral conductance but has a transversal conductance that is sufficiently high to allow loss free transport. Furthermore, the composition of the interconnect layer developed by the present inventors can be varied in order to tune the refractive index so as to reduce reflection losses whilst maintaining a sufficient transversal conductivity.

Specifically, the present inventors propose replacing the conventional TCO layer with a layer of a two-phase material comprising elongate, filament-like silicon nanocrystals embedded in an amorphous hydrogenated silicon oxide matrix (herein referred to as nc-SiOx:H). Such two-phase materials may be fabricated by plasma-enhanced chemical vapor deposition (PECVD) using conditions that result in the formation of the elongate silicon nanocrystals during growth of the nc-SiOx:H film wherein the longitudinal axis of the elongate silicon nanocrystals are substantially perpendicular to the substrate (i.e. are oriented transversely within the nc-SiOx:H film). The lateral conductivity of the layer of two-phase material, which will depend on stoichiometry and nanostructure, can therefore be one or more, preferably two or more, further preferably three or more, highly preferably several, orders of magnitude lower than the transversal conductivity. Thus, using such layer, a low-ohmic tunnel recombination contact can be realized due to the high transversal conductivity, whilst the low lateral conductivity reduces the detrimental influence of shunt paths. Furthermore, the two-phase nature of the material allows the effective refractive index of the material to be tuned by varying the fraction and composition of the a-SiOx:H phase over a wide range whilst maintaining a sufficiently high transversal conductivity, which is thought to be provided by the doped nanocrystalline phase.

Therefore, according to a first aspect there is provided a multi-junction photovoltaic device comprising a first sub-cell comprising a photoactive region comprising a layer of perovskite material, a second sub-cell comprising a photoactive silicon absorber and an intermediate region disposed between and connecting the first sub-cell and the second sub-cell. The intermediate region comprises an interconnect layer, the interconnect layer comprising a two-phase material comprising elongate (i.e. filament like) silicon nanocrystals embedded in a silicon oxide matrix.

Preferably, a longitudinal axis of the elongate silicon nanocrystals is substantially perpendicular to opposing surfaces of the first photovoltaic sub-cell and the second photovoltaic sub-cell.

The silicon oxide matrix preferably comprises amorphous hydrogenated silicon oxide. The silicon oxide matrix may have an oxygen fraction from 10 to 50%.

The diameter of the elongate silicon nanocrystals may be less than 50 nm, is preferably equal to or less than 10 nm, and is more preferably equal to or less than 5 nm. The two-phase material may comprise from 10 to 50% silicon nanocrystals by volume. The elongate silicon nanocrystals are preferably doped, with either n-type or p-type doping.

The lateral conductivity of the interconnect layer may be several orders of magnitude lower than a transversal conductivity the interconnect layer. The interconnect layer preferably has a thickness from 5 nm to 200 nm, preferably from 70 nm to 90 nm, and more preferably around 80 nm. The interconnect layer preferably has a refractive index (n) in the range 2.70 to 2.90, preferably in the range 2.75 to 2.85, further preferably in the range 2.79 to 2.81, and particularly preferably it has a refractive index of 2.8.

Preferably, the two-phase material consists of silicon nanocrystals embedded in a silicon oxide matrix.

The intermediate region may comprise one or more further layers.

The intermediate region may further comprise a layer of transparent conducting oxide (TCO). The layer of transparent conducting oxide (TCO) may be disposed between the between the interconnect layer and the first photovoltaic sub-cell. The layer of transparent conducting oxide (TCO) preferably has a thickness from 1 nm to 20 nm, preferably from 5 nm to 20 nm, and more preferably from 10 nm to 20 nm.

The intermediate region may further comprise a recombination layer. The recombination layer may be disposed between the interconnect layer and the second photovoltaic sub-cell. Alternatively, the recombination layer may be disposed between the interconnect layer and the first photovoltaic sub-cell. Preferably, the recombination layer comprises n-doped nanocrystalline silicon.

The intermediate region may further comprise a further interconnect layer comprising a two-phase material comprising silicon nanocrystals embedded in a silicon oxide matrix. Preferably, one of the interconnect layer and the further interconnect layer comprises n-doped elongate silicon nanocrystals and the other of the interconnect layer and the further interconnect layer comprises p-doped elongate silicon nanocrystals.

The first sub-cell may comprise a p-type region and an n-type region, with the photoactive region being disposed between the p-type region and the n-type region.

The first photovoltaic sub-cell may have a regular structure. The first photovoltaic sub-cell is then arranged such that the n-type region is adjacent to the second sub-cell. The photovoltaic device is then preferably configured so as to be illuminated through a p-type region of the first sub-cell. Alternatively, the first photovoltaic sub-cell may have an inverted structure. The first photovoltaic sub-cell is then arranged such that the p-type region is adjacent to the second sub-cell. The photovoltaic device is then preferably configured so as to be illuminated through an n-type region of the first sub-cell.

The second sub-cell may comprise a diffused silicon junction. The second sub-cell may comprise a silicon heterojunction (SHJ).

The first sub-cell preferably comprises a layer of perovskite material of general formula (I):

wherein [A] is one or more monovalent cations, [B] is one or more divalent inorganic cations, and [X] is one or more halide anions.

[X] may comprise one or more halide anions selected from fluoride, chloride, bromide, and iodide, and preferably selected from chloride, bromide and iodide, and more preferably selected from bromide and iodide. Preferably, [X] comprises two different halide anions selected from fluoride, chloride, bromide, and iodide, and preferably selected from chloride, bromide and iodide, and more preferably comprises bromide and iodide.

[A] may comprise one or more organic cations selected from methylammonium ($CH_3NH_3^+$), formamidinium ($HC(NH_2)_2^+$), and ethyl ammonium ($CH_3CH_2NH_3^+$), and preferably comprises one organic cation selected from methylammonium ($CH_3NH_3^+$) and formamidinium ($HC(NH_2)_2^+$). In addition, or alternatively, [A] may comprise one or more inorganic cations selected from $Cs^+$, $Rb^+$, $Cu^+$, $Pd^+$, $Pt^+$, $Ag^+$, $Au^+$, $Rh^+$, and $Ru^+$.

[B] may comprise at least one divalent inorganic cation selected from $Pb^{2+}$ and $Sn^{2+}$, and preferably comprises $Pb^{2+}$.

Preferably, the perovskite material is of general formula (IA):

wherein A is selected from methylammonium (MA) and formamidinium (FA), A' is selected from formamidinium (FA) and a caesium cation (Cs$^+$), B is selected from Pb$^{2+}$ and Sn$^{2+}$, X is iodide and X' is bromide, and wherein 0<x≤1 and 0<y≤1.

BRIEF DESCRIPTION OF THE DRAWINGS

The present invention will now be more particularly described by way of example only with reference to the accompanying drawings, in which:

FIGS. 7 to 14 illustrate schematically specific examples of the monolithically integrated multi-junction photovoltaic device as described herein;

DETAILED DESCRIPTION

Definitions

Figure 1:
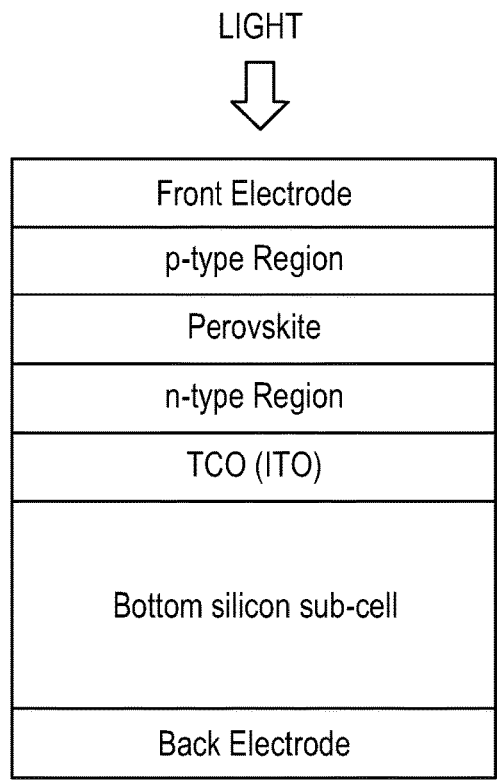
FIG. 1 illustrates schematically a conventional monolithically integrated multi-junction photovoltaic device that comprises a top perovskite based sub-cell and a bottom silicon based sub-cell.
Figure 2:
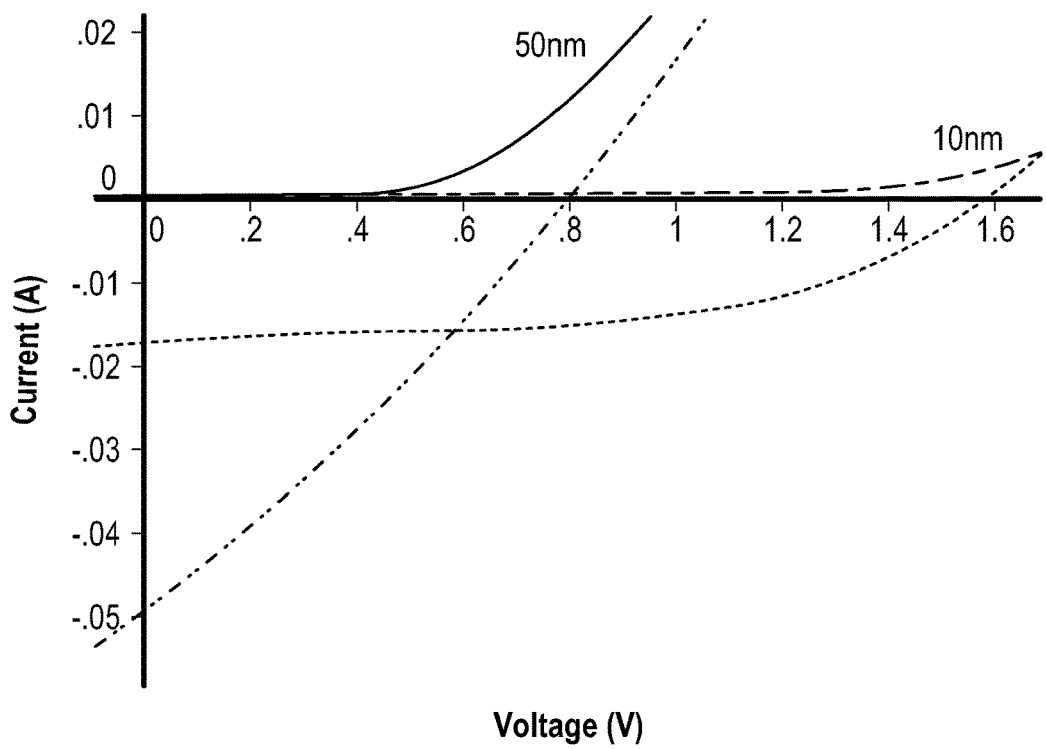
FIG. 2 shows the light and dark current-voltage characteristics of two perovskite/silicon tandem solar cells having a TCO layer of 50 nm and a 10 nm thickness respectively.
Figure 3:
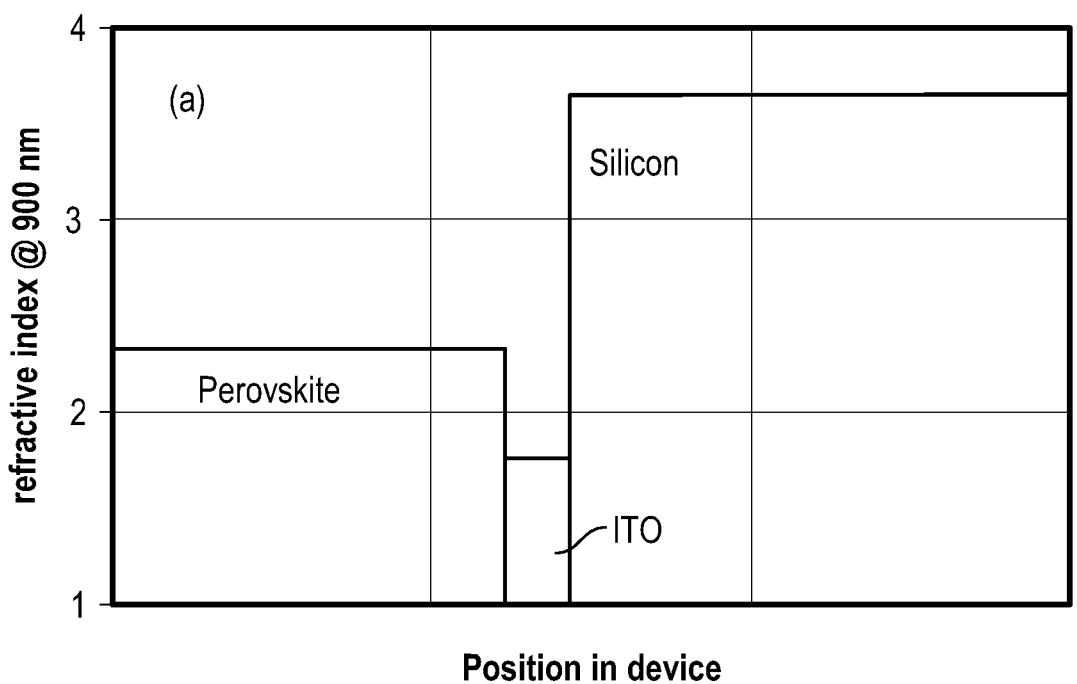
FIG. 3 illustrates schematically the refractive index layout near the contact between the two sub cells for a conventional monolithically integrated photovoltaic device.

The term "matrix", as used herein, refers to a fine-grained material in which larger objects are embedded.

The term "photoactive", as used herein, refers to a region, layer or material that is capable of responding to light photoelectrically. A photoactive region, layer or material is therefore capable of absorbing the energy carried by photons in light that then results in the generation of electricity (e.g. by generating either electron-hole pairs or excitons).

The term "perovskite", as used herein, refers to a material with a three-dimensional crystal structure related to that of CaTiO$_3$ or a material comprising a layer of material, which layer has a structure related to that of CaTiO$_3$. The structure of CaTiO$_3$ can be represented by the formula ABX$_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by CaTiO$_3$ to a lower-symmetry distorted structure. The symmetry will also be lower if the material comprises a layer that has a structure related to that of CaTiO$_3$. Materials comprising a layer of perovskite material are well known. For instance, the structure of materials adopting the K$_2$NiF$_4$ type structure comprises a layer of perovskite material. The skilled person will appreciate that a perovskite material can be represented by the formula [A][B][X]$_3$, wherein [A] is at least one cation, [B] is at least one cation and [X] is at least one anion. When the perovskite comprises more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will often be lower than that of CaTiO$_3$.

As mentioned in the preceding paragraph, the term "perovskite", as used herein, refers to (a) a material with a three-dimensional crystal structure related to that of CaTiO$_3$ or (b) a material comprising a layer of material, wherein the layer has a structure related to that of CaTiO$_3$. Although both of these categories of perovskite may be used in the devices according to the invention, it is preferable in some circumstances to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is [2-(1-cyclohexenyl)ethylammonium]$_2$PbBr$_4$. 2D layered perovskites tend to have high exciton binding energies, which favours the generation of bound electron-hole pairs (excitons), rather than free charge carriers, under photoexcitation. The bound electronhole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite of the first category, (a), i.e. a perovskite which has a three-dimensional crystal structure. This is particularly preferable when the optoelectronic device is a photovoltaic device.

The perovskite material employed in the present invention is one which is capable of absorbing light and thereby generating free charge carriers. Thus, the perovskite employed is a light-absorbing perovskite material. However, the skilled person will appreciate that the perovskite material could also be a perovskite material that is capable of emitting light, by accepting charge, both electrons and holes, which subsequently recombine and emit light. Thus, the perovskite employed may be a light-emitting perovskite.

As the skilled person will appreciate, the perovskite material employed in the present invention may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material.

Typically, the perovskite semiconductor used in the present invention is a photosensitizing material, i.e. a material which is capable of performing both photogeneration and charge transportation.

The term "mixed-anion", as used herein, refers to a compound comprising at least two different anions. The term "halide" refers to an anion of an element selected from Group 17 of the Periodic Table of the Elements, i.e., of a halogen. Typically, halide anion refers to a fluoride anion, a chloride anion, a bromide anion, an iodide anion or an astatide anion.

The term "metal halide perovskite", as used herein, refers to a perovskite, the formula of which contains at least one metal cation and at least one halide anion. The term "organometal halide perovskite", as used herein, refers to a metal halide perovskite, the formula of which contains at least one organic cation.

The term "organic material" takes its normal meaning in the art. Typically, an organic material refers to a material comprising one or more compounds that comprise a carbon atom. As the skilled person would understand it, an organic compound may comprise a carbon atom covalently bonded to another carbon atom, or to a hydrogen atom, or to a halogen atom, or to a chalcogen atom (for instance an oxygen atom, a sulphur atom, a selenium atom, or a tellurium atom). The skilled person will understand that the term "organic compound" does not typically include compounds that are predominantly ionic such as carbides, for instance.

The term "organic cation" refers to a cation comprising carbon. The cation may comprise further elements, for example, the cation may comprise hydrogen, nitrogen or oxygen. The term "inorganic cation" refers to a cation that is not an organic cation. By default, the term "inorganic cation" refers to a cation that does not contain carbon.

The term "semiconductor", as used herein, refers to a material with electrical conductivity intermediate in magnitude between that of a conductor and a dielectric. A semiconductor may be an n-type semiconductor, a p-type semiconductor or an intrinsic semiconductor.

The term "dielectric", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV (The band gap of titania is about 3.2 eV.)

The term "n-type", as used herein, refers to a region, layer or material that comprises an extrinsic semiconductor with a larger concentration of electrons than holes. In n-type semiconductors, electrons are therefore majority carriers and holes are the minority carriers, and they are therefore electron transporting materials. The term "n-type region", as used herein, therefore refers to a region of one or more electron transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

The term "p-type", as used herein, refers to a region, layer or material that comprises an extrinsic semiconductor with a larger concentration of holes than electrons. In p-type semiconductors, holes are the majority carriers and electrons are the minority carriers, and they are therefore hole transporting materials. The term "p-type region", as used herein, therefore refers to a region of one or more hole transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "band gap", as used herein, refers to the energy difference between the top of the valence band and the bottom of the conduction band in a material. The skilled person may readily measure the band gap of a material without undue experimentation.

The term "layer", as used herein, refers to any structure which is substantially laminar in form (for instance extending substantially in two perpendicular directions, but limited in its extension in the third perpendicular direction). A layer may have a thickness which varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

The term "porous", as used herein, refers to a material within which pores are arranged. Thus, for instance, in a porous material the pores are volumes within the body of the material where there is no material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (Rouquerol, J. et al, (1994) Recommendations for the characterization of porous solids (Technical Report). Pure and Applied Chemistry, 66(8)). The following distinctions and definitions were adopted in previous IUPAC documents (J. Haber. (1991) Manual on catalyst characterization (Recommendations 1991). Pure and Applied Chemistry.): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid to which the material is exposed. An "open pore" on the other hand, would be accessible by such a fluid. The concepts of open and closed porosity are discussed in detail in J. Rouquerol et al.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". The term "without open porosity", as used herein, therefore refers to a material with no effective porosity. Thus, a material without open porosity typically has no macropores and no mesopores. A material without open porosity may comprise micropores and nanopores, however. Such micropores and nanopores are typically too small to have a negative effect on a material for which low porosity is desired.

In addition, polycrystalline materials are solids that are composed of a number of separate crystallites or grains, with grain boundaries at the interface between any two crystallites or grains in the material. A polycrystalline material can therefore have both interparticle/interstitial porosity and intraparticle/internal porosity. The terms "interparticle porosity" and "interstitial porosity", as used herein, refer to pores between the crystallites or grains of the polycrystalline material (i.e. the grain boundaries), whilst the terms "intraparticle porosity" and "internal porosity", as used herein, refer to pores within the individual crystallites or grains of the polycrystalline material. In contrast, a single crystal or monocrystalline material is a solid in which the crystal lattice is continuous and unbroken throughout the volume of the material, such that there are no grain boundaries and no interparticle/interstitial porosity.

The term "compact layer", as used herein, refers to a layer without mesoporosity or macroporosity. A compact layer may sometimes have microporosity or nanoporosity.

The term "scaffold material", as used herein, therefore refers to a material that is capable of acting as a support for a further material. The term "porous scaffold material", as used herein, therefore refers to a material which is itself porous, and which is capable of acting as a support for a further material.

The term "transparent", as used herein, refers to material or object allows light to pass through almost undisturbed so that objects behind can be distinctly seen. The term "semi-transparent", as used herein, therefore refers to material or object which has a transmission (alternatively and equivalently referred to as a transmittance) to light intermediate between a transparent material or object and an opaque material or object. Typically, a transparent material will have an average transmission for light of around 100%, or from 90 to 100%. Typically, an opaque material will have an average transmission for light of around 0%, or from 0 to 5%. A semi-transparent material or object will typically have an average transmission for light of from 10 to 90%, typically 40 to 60%. Unlike many translucent objects, semi-transparent objects do not typically distort or blur images. Transmission for light may be measured using routine methods, for instance by comparing the intensity of the incident light with the intensity of the transmitted light.

The term "electrode", as used herein, refers to a conductive material or object through which electric current enters or leaves an object, substance, or region. The term "negative electrode", as used herein, refers to an electrode through which electrons leave a material or object (i.e. an electron collecting electrode). A negative electrode is typically referred to as an "anode". The term "positive electrode", as used herein, refers to an electrode through which holes leave a material or object (i.e. a hole collecting electrode). A positive electrode is typically referred to as a "cathode". Within a photovoltaic device, electrons flow from the positive electrode/cathode to the negative electrode/anode, whilst holes flow from the negative electrode/anode to the positive electrode/cathode.

The term "front electrode", as used herein, refers to the electrode provided on that side or surface of a photovoltaic device that it is intended will be exposed to sun light. The front electrode is therefore typically required to be transparent or semi-transparent so as to allow light to pass through the electrode to the photoactive layers provided beneath the front electrode. The term "back electrode", as used herein, therefore refers to the electrode provided on that side or surface of a photovoltaic device that is opposite to the side or surface that it is intended will be exposed to sun light.

The term "charge transporter" refers to a region, layer or material through which a charge carrier (i.e. a particle carrying an electric charge), is free to move. In semiconductors, electrons act as mobile negative charge carriers and holes act as mobile positive charges. The term "electron transporter" therefore refers to a region, layer or material through which electrons can easily flow and that will typically reflect holes (a hole being the absence of an electron that is regarded as a mobile carrier of positive charge in a semiconductor). Conversely, the term "hole transporter" refers to a region, layer or material through which holes can easily flow and that will typically reflect electrons.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

Device Structure—General

Figure 4:
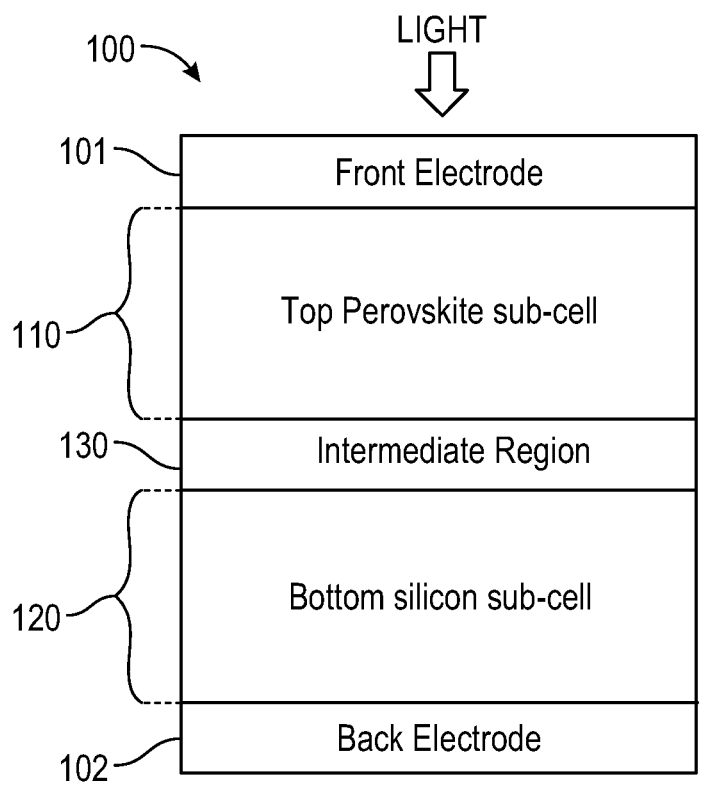
FIG. 4 illustrates schematically a monolithically integrated multi-junction photovoltaic device as described herein.

FIG. 4 illustrates schematically a monolithically integrated multi-junction photovoltaic device 100 that comprises a first/top sub-cell 110 comprising a photoactive region that comprises a perovskite material, whilst the second/bottom sub-cell 120 comprises a photoactive silicon absorber. The multi-junction photovoltaic device 100 has a monolithically integrated structure and therefore comprises just two electrodes, a front/first electrode 101 and a back/second electrode 102, with the first/top sub-cell 110 and the second/bottom sub-cell 120 disposed between these two electrodes. In particular, the first sub-cell 110 is in contact with the first/front electrode 101 and the second sub-cell 120 is in contact with the second/back electrode 102. The monolithically integrated multi-junction photovoltaic device 100 typically also comprises a metal grid on the top surface of the front/first electrode 101 as a top contact (not shown). By way of example, the top contact could be provided a metal grid or fingers produced by screen printing of a silver and/or copper paste.

In addition, as the monolithically integrated structure comprises just two electrodes, the first and second sub-cells 110, 120 are then connected to one another by an intermediate region 130 comprising one or more interconnect layers. In a monolithically integrated multi-junction photovoltaic device the individual sub-cells are electrically connected in series, which results in the need for a recombination layer or a tunnel junction and current matching between the sub-cells.

The intermediate region 130 comprises an interconnect layer 131. The interconnect layer 131 comprises a two-phase material comprising elongate (i.e. filament like) silicon nanocrystals (nc-Si:H) 131a embedded in a silicon oxide matrix 131b (herein referred to as nc-SiOx:H). A longitudinal axis of the elongate silicon nanocrystals 131a is substantially perpendicular to opposing surfaces of the first sub-cell 110 and the second sub-cell 120 (i.e. the elongate silicon nanocrystals are oriented transversely within the nc-SiOx:H film 131). Preferably, the two-phase material of the interconnect layer 131 consists of silicon nanocrystals embedded in a silicon oxide matrix.

The elongate silicon nanocrystals 131a are preferably doped, with either n-type or p-type doping, and the silicon oxide matrix 131b preferably comprises amorphous hydrogenated silicon oxide (a-SiOx:H).

The interconnect layer 131 preferably has a thickness from 5 nm to 200 nm, preferably from 70 nm to 90 nm, and more preferably around 80 nm.

The lateral conductivity of the interconnect layer 131 of two-phase material will depend on stoichiometry and nanostructure and can be several orders of magnitude lower than the transversal conductivity. In this regard, the diameter of the elongate silicon nanocrystals 131a may be less than 50 nm, is preferably equal to or less than 10 nm, and is more preferably equal to or less than 5 nm. In addition, the two-phase material of the interconnect layer 131 may comprise from 10 to 50% silicon nanocrystals by volume.

Also, the two-phase nature of the interconnect layer 131 allows the effective refractive index to be tuned by varying the fraction and composition of the a-SiOx:H phase over a wide range whilst maintaining a sufficiently high transversal conductivity, which is thought to be provided by the doped nanocrystalline phase. Preferably, the silicon oxide matrix has an oxygen fraction from 10 to 50%.

Figure 5:
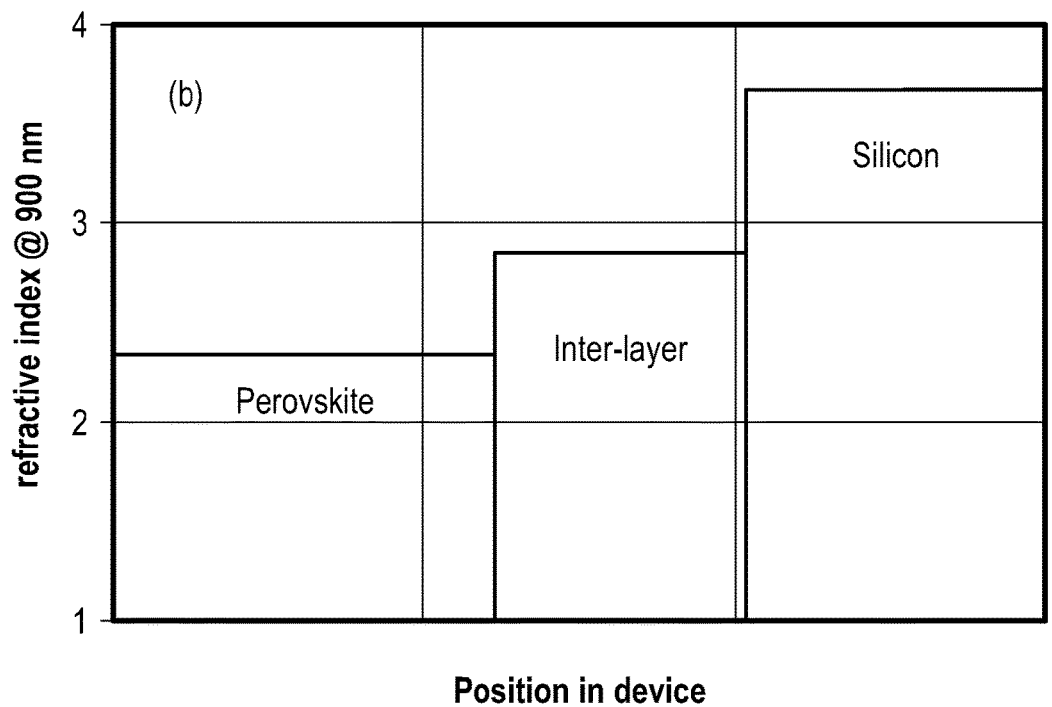
FIG. 5 illustrates schematically the refractive index layout near the contact between the two sub cells for a monolithically integrated multi-junction photovoltaic device as described herein.

The intermediate region 130/interconnect layer 131 also preferably has a refractive indices (n) of approximately 2.8. In this regard, it is preferable that the refractive indices (n) of the intermediate region 130 is between that of perovskite and silicon and, if the intermediate region 130 comprises more than one layer, that the refractive indices of each layer in the intermediate region 130 increase in the direction of the light path. Consequently, for a single layer intermediate region 130, the ideal n would be close to the geometric mean of the refractive indices of the two absorber layers (n~2.8), as shown schematically in FIG. 5, and the thickness should be close to a quarter of the optical thickness for the relevant wavelength range (700-1200 nm).

Figure 6:
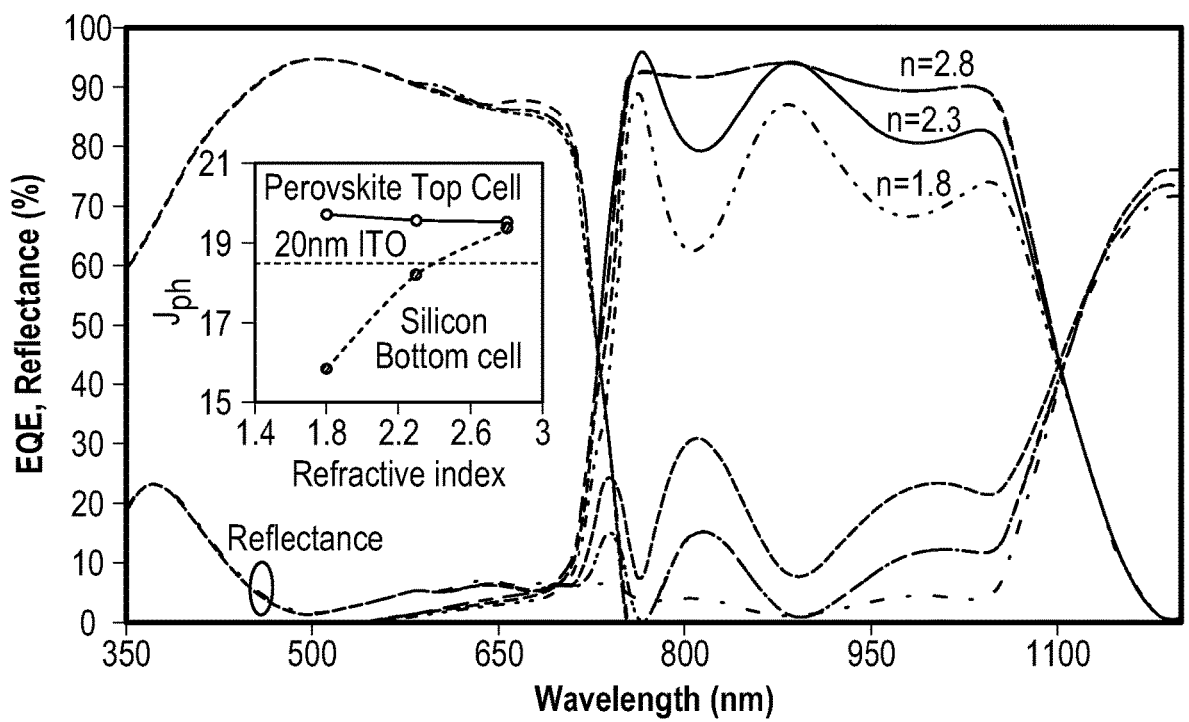
FIG. 6 shows the simulated reflectance and external quantum efficiency (EQE) spectra of the top and the bottom cell of perovskite/silicon tandem solar cells with an 80 nm interconnect layer as described herein.

Results of optical simulations performed to optimize the system are presented in FIG. 6, which shows the simulated reflectance and external quantum efficiency spectra of (inverted) perovskite/silicon tandem cells having an 80 nm thick interconnect layer 131 as described herein having the indicated, wavelength-independent real part of the refractive index. As can be seen from the graph, the interference fringes visible in the reflectance and in the bottom cell EQE spectra at ~850 nm and ~1000 nm wavelength, which originate from reflection at the silicon surface, can be significantly reduced by tuning n. From the inlet, it can be seen that with n=2.8, the current density in the limiting bottom cell (and therewith of the tandem cell) can be enhanced by more than 3 mA/cm$^2$. Compared to the current state-of-the-art (20 nm ITO), this is an enhancement of 5%.

Depending upon the structure of the photovoltaic device 100, it may be advantageous for the intermediate region 130 to comprise one or more further layers, as illustrated in the examples of FIGS. 7 to 14.

For example, as shown in FIGS. 7 to 9, the intermediate region 130 may comprise a recombination layer 132. The recombination layer 132 may be disposed between the interconnect layer 131 and the second photovoltaic sub-cell 120. Alternatively, the recombination layer 132 may be disposed between the interconnect layer 131 and the first photovoltaic sub-cell 110. Preferably, the recombination layer comprises n-doped nanocrystalline silicon. In this regard, such a recombination layer 132 has a positive effect on the recombination of charge carriers. In addition, when such a recombination layer 132 is disposed between the interconnect layer 131 and the second photovoltaic sub-cell 120 not only does this have a positive effect on the recombination of charge carries, but it also provides a substrate that acts as a nucleation layer for easier growth of the elongate silicon nanocrystals (nc-Si:H) 131a.

By way of further example, as shown in FIGS. 9 and 11, the intermediate region may further comprise a layer of transparent conducting oxide (TCO) 133. The layer of transparent conducting oxide (TCO) 133 may be disposed between the between the interconnect layer 131 and the first photovoltaic sub-cell 110. The layer of transparent conducting oxide (TCO) 133 preferably has a thickness from 1 nm to 20 nm, preferably from 5 nm to 20 nm, and more preferably from 10 nm to 20 nm. In particular, such a thin layer of TCO 133 provided between the interconnect layer 131 and the first photovoltaic sub-cell 110 can serve to protect the interconnect layer 131 during deposition of the first photovoltaic sub-cell 110.

As a yet further example, as shown in FIGS. 10 and 14, the intermediate region 130 may further comprise a further interconnect layer 134 comprising a two-phase material comprising elongate 134a silicon nanocrystals embedded in a silicon oxide matrix 134b. Preferably, one of the interconnect layer 131 and the further interconnect layer 134 comprises n-doped elongate silicon nanocrystals and the other of the interconnect layer 131 and the further interconnect layer 134 comprises p-doped elongate silicon nanocrystals.

In more detail, FIGS. 7 to 14 illustrate schematically various embodiments of the monolithically integrated multi-junction photovoltaic device as described herein. In these specific examples, the second/bottom sub-cell 120 comprises a silicon heterojunction (SHJ); however, the second/bottom sub-cell 120 could equally comprise other forms of silicon based sub-cells, such as a diffused silicon junction.

The term silicon heterojunction (SHJ) refers to an amorphous silicon/crystalline silicon heterojunction that makes use of a crystalline silicon (c-Si) wafer as a photoactive absorber and amorphous silicon (a-Si) thin-films for junction formation and surface passivation. A silicon heterojunction (SHJ) is sometimes also referred to as a heterojunction with intrinsic thin layer (HIT) when any thin layers of intrinsic amorphous silicon (a-Si) are present as passivation/buffer layers. A silicon heterojunction (SHJ) therefore typically comprises a p-type a-Si emitter, an intrinsic a-Si passivation/buffer layer, an n-type c-Si photoactive absorber, another intrinsic a-Si passivation/buffer layer, and a back-surface field (BSF) layer made of n-type a-Si. Optionally, a silicon heterojunction (SHJ) can further comprise a layer of a transparent conducting oxide (TCO) (e.g. ITO) between the back-surface field (BSF) layer and the back electrode. When present, this rear layer of TCO assists in maximising the infrared response by increasing internal reflectance at the rear surface.

In the example of FIGS. 7 to 14, the first sub-cell 110 comprises a p-type region and an n-type region, with the photoactive region being disposed between the p-type region and the n-type region.

In the example of FIGS. 7 to 10, the first sub-cell 110 has a regular structure. Specifically, the first sub-cell 110 is arranged such that the n-type region is adjacent to the second sub-cell 120. The photovoltaic device 100 is then configured so as to be illuminated through a p-type region of the first sub-cell 110.

In the examples of FIGS. 11 to 14, the first sub-cell 110 has an inverted structure. Specifically, the first sub-cell 110 is arranged such that the p-type region is adjacent to the second sub-cell 120. The photovoltaic device 100 is then configured so as to be illuminated through an n-type region of the first sub-cell 110.

The example of FIG. 7 illustrates schematically a monolithically integrated multi-junction photovoltaic device 100 in which the first sub-cell 110 has a regular structure. In this example, the intermediate region 130 comprises an interconnect layer 131 and a recombination layer 132. The interconnect layer 131 comprises n-doped elongate silicon nanocrystals (nc-Si:H) 131a. A highly (n+) doped recombination layer 132 is then provided between the interconnect layer 131 and the second sub-cell 120. Specifically, the highly (n+) doped recombination layer 132 is provided on the p-type a-Si emitter of the second sub-cell 120.

The example of FIG. 8 illustrates schematically a monolithically integrated multi-junction photovoltaic device 100 in which the first sub-cell 110 has a regular structure. In this example, the intermediate region 130 again comprises an interconnect layer 131 and a recombination layer 132. The interconnect layer 131 comprises p-doped elongate silicon nanocrystals (nc-Si:H) 131a. A highly (n+) doped recombination layer 132 is then provided between the interconnect layer 131 and the first sub-cell 110. Whilst the illustrated example shows the emitter of the second sub-cell 120 as a p-type a-Si emitter, in a preferred embodiment, the emitter of the second sub-cell 120 would comprise a layer of nc-Si:H to function as a nucleation layer for the elongate silicon nanocrystals.

The example of FIG. 9 illustrates schematically a monolithically integrated multi-junction photovoltaic device 100 in which the first sub-cell 110 has a regular structure. In this example, the intermediate region 130 comprises an interconnect layer 131, a recombination layer 132, and an additional layer of TCO 133. The interconnect layer 131 comprises n-doped elongate silicon nanocrystals (nc-Si:H) 131a. A highly (n+) doped recombination layer 132 is then provided between the interconnect layer 131 and the second sub-cell 120. Specifically, the highly (n+) doped recombination layer 132 is provided on the p-type a-Si emitter of the second sub-cell 120. This example also includes the additional layer of TCO 133 to protect the stack from oxidation before deposition of an electron transport layer (ETL) of the n-type region of the first sub-cell 110. In this configuration, the TCO can be very thin (i.e. 20 nm or less) and with a very low carrier density, thereby ensuring that the shunt quenching effect can be sustained.

The example of FIG. 10 illustrates schematically a monolithically integrated multi-junction photovoltaic device 100 in which the first sub-cell 110 has a regular structure. In this example, the intermediate region 130 comprises an interconnect layer 131 and a further interconnect layer 134. The further interconnect layer 134 comprising a two-phase material comprising elongate 134a silicon nanocrystals embedded in a silicon oxide matrix 134b. The interconnect layer 131 comprises n-doped elongate silicon nanocrystals (nc-Si:H) 131a. The further interconnect layer 134 then comprises p-doped elongate silicon nanocrystals (nc-Si:H) 134a.

The example of FIG. 11 illustrates schematically a monolithically integrated multi-junction photovoltaic device 100 in which the first sub-cell 110 has an inverted structure. In this example, the intermediate region 130 comprises an interconnect layer 131 and a layer of TCO 133. The interconnect layer 131 comprises n-doped elongate silicon nanocrystals (nc-Si:H) 131a and is provided on the n-type a-Si emitter of the second sub-cell 120. The layer of TCO 133 is provided to protect the stack from oxidation before deposition of a hole transport layer (HTL) of the p-type region of the first sub-cell 110. In this configuration, the TCO can be very thin (i.e. 20 nm or less) and with a very low carrier density, thereby ensuring that the shunt quenching effect can be sustained.

The example of FIG. 12 illustrates schematically a monolithically integrated multi-junction photovoltaic device 100 in which the first sub-cell 110 has an inverted structure. In this example, the intermediate region 130 comprises only an interconnect layer 131 (i.e. consists of the interconnect layer 131). The interconnect layer 131 comprises n-doped elongate silicon nanocrystals (nc-Si:H) 131a and is provided on the n-type a-Si emitter of the second sub-cell 120.

The example of FIG. 13 illustrates schematically a monolithically integrated multi-junction photovoltaic device 100 in which the first sub-cell 110 has an inverted structure. In this example, the intermediate region 130 comprises only an interconnect layer 131 (i.e. consists of the interconnect layer 131). The interconnect layer 131 comprises p-doped elongate silicon nanocrystals (nc-Si:H) 131a and is provided directly on an intrinsic a-Si passivation/buffer layer of the second sub-cell 120. In other words, in this example, the second sub-cell 120 does not have an n-type a-Si emitter layer.

The example of FIG. 14 illustrates schematically a monolithically integrated multi-junction photovoltaic device 100 in which the first sub-cell 110 has an inverted structure. In this example, the intermediate region 130 comprises an interconnect layer 131 and a further interconnect layer 134. Both the interconnect layer 131 and the further interconnect layer 134 comprise n-doped elongate silicon nanocrystals (nc-Si:H) 131a, 134a. The further interconnect layer 134 is provided directly on an intrinsic a-Si passivation/buffer layer of the second sub-cell 120. In other words, in this example, the second sub-cell 120 does not have an n-type a-Si emitter layer. In this example, the n-type nc-SiOx:H film is made as a double/graded layer, which can further reduce reflection losses and also allow better independent control of the two functions (reduced reflection and reduced shunting). Advantageously, the further interconnect layer 134 has a higher refractive index and lower lateral conductivity relative to the interconnect layer 131.

Current-Voltage Measurements

Current-voltage (IV) measurements were performed using a Keithley model 2600 digital source meter and OAI trisol solar simulator with a single light source and controlled with a calibrated silicon reference cell with a BG4 filter. In this way, the top cell relevant fraction of the incidence spectrum is measured. The intensity during the measurement was at 95% of the equivalent of 1 sun. IV characteristics were measured using both reverse-forward and forward-reverse bias sweep, as well as a perturb-and-measure maximum power point (MPP) tracking algorithm to confirm stabilized power output. The fill factor (FF) and the open circuit voltage ($V_{oc}$) were calculated. The external quantum efficiency (EQE) was recorded for each respective sub cell using a Bentham PVE300 setup to obtain the short-circuit current density ($J_{sc,\ EQE}$). Total reflection measurements were performed using a PerkinElmer Lambda950 tool and the small spot kit.

The simulations were performed using the transfer-matrix method. In this approach, the optical properties as well as the thickness of each layer in the model stack are considered and the light propagation and absorption in each layer is calculated considering also coherence effects.

Determination of the Improvements in Short Circuit Current Density ($J_{SC,\ EQE}$) which are Obtained by Using a Monolithically Integrated Multi-Junction Photovoltaic Device of the Type Schematically Shown in FIG. 11.

Figure 15:
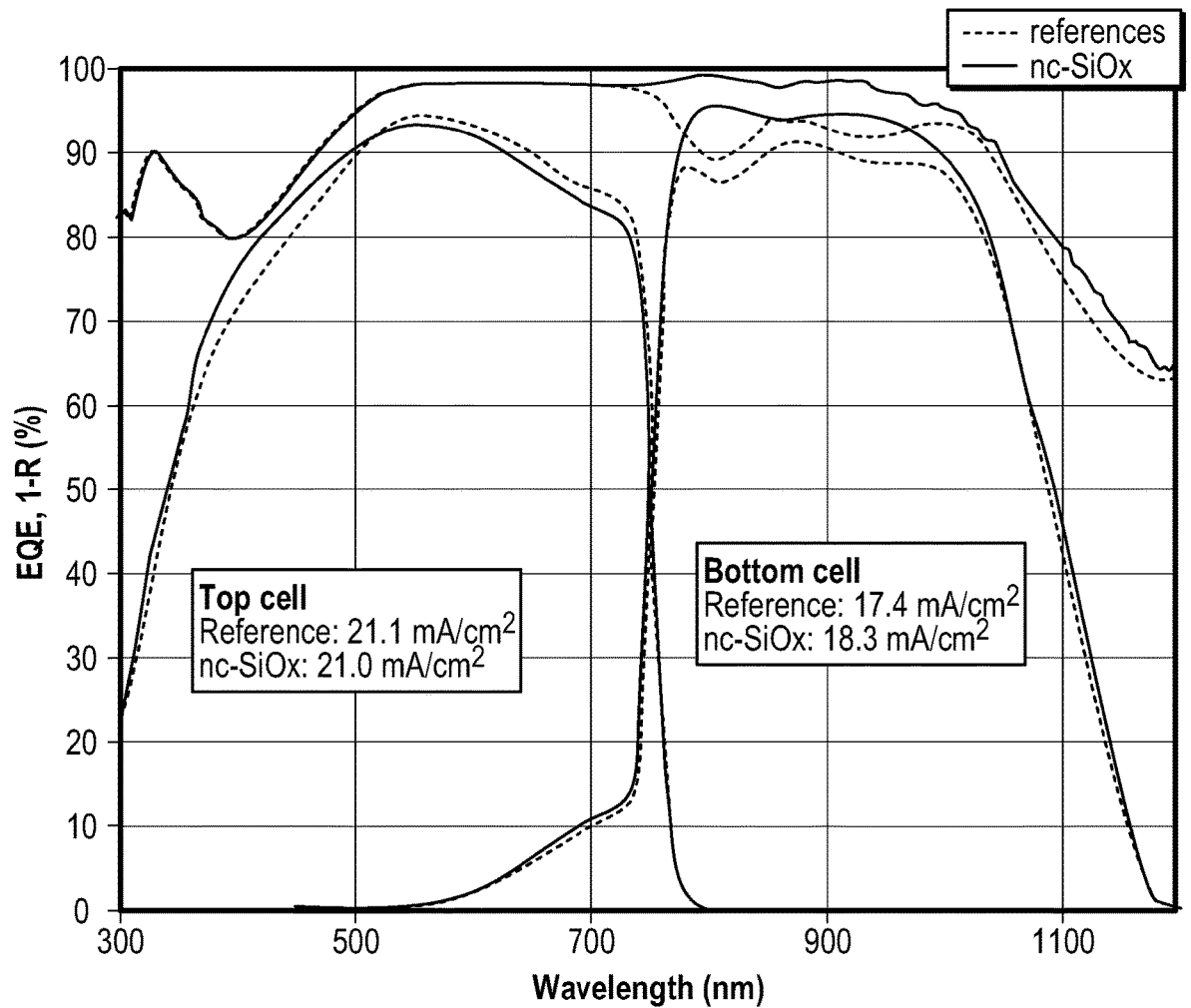
FIG. 15 illustrates the external quantum efficiency (EQE) and 1–total reflection for the example photovoltaic device shown in FIG. 11 which has an nc-SiOx:H interlayer (n=2.7, 100 nm) and compares this with the EQE obtained for a similar reference cell which has an inter connection layer comprising nc-Si:H.

FIG. 15 provides a comparison of the external quantum efficiency (EQE) for a monolithically integrated multi-junction photovoltaic device of FIG. 11 with the EQE for a reference device which is similar but has a nanocrystalline silicon interconnect layer which lacks oxygen i.e. an nc-Si:H layer. Both cells have a band gap of around 1.64 eV. Although the device schematically shown in FIG. 11 has a top-cell current which is too high, it can nevertheless be seen that due to suppressed reflection losses in the range of 750-1000 nm wavelength, the bottom cell gains 0.9 mA/cm$^2$ at almost constant top cell current. Table 1 below lists the experimental and simulated EQE results for all of the sub cells in the test and reference photovoltaic devices; it will be noted that there is an excellent correlation between the experimental current and the current predicted by the simulations.

TABLE 1

Current determined from EQE and reflection measurements and the corresponding results obtained from the optical simulations

| nc-SiOx:H | | Top cell | | Bottom cell | | R_tot | |
|---|---|---|---|---|---|---|---|
| thickn nm | RI | Exp | Sim | Exp | Sim | Exp | Sim |
| | | integrated values (300-1200 nm) in mA/cm$^2$ | | | | | |
| 0 | — | 21.1 | 21.3 | 17.4 | 17.1 | 3.9 | 4.0 |
| 20 | 2.7 | | 21.3 | | 16.9 | | 4.1 |
| 50 | 2.7 | 21 | 21.2 | 17.7 | 17.5 | 4.4 | 3.6 |
| 80 | 2.7 | 21.3 | 21.2 | 18.4 | 18.4 | 3.6 | 2.7 |
| 100 | 2.7 | 21 | 21.2 | 18.3 | 18.6 | 3 | 2.4 |
| 50 | 3 | 21 | 21.2 | 17.9 | 17.7 | 3.8 | 3.4 |
| 50 | 2.3 | 21.1 | 21.3 | 16.6 | 16.7 | 5.2 | 4.3 |

Figure 16:
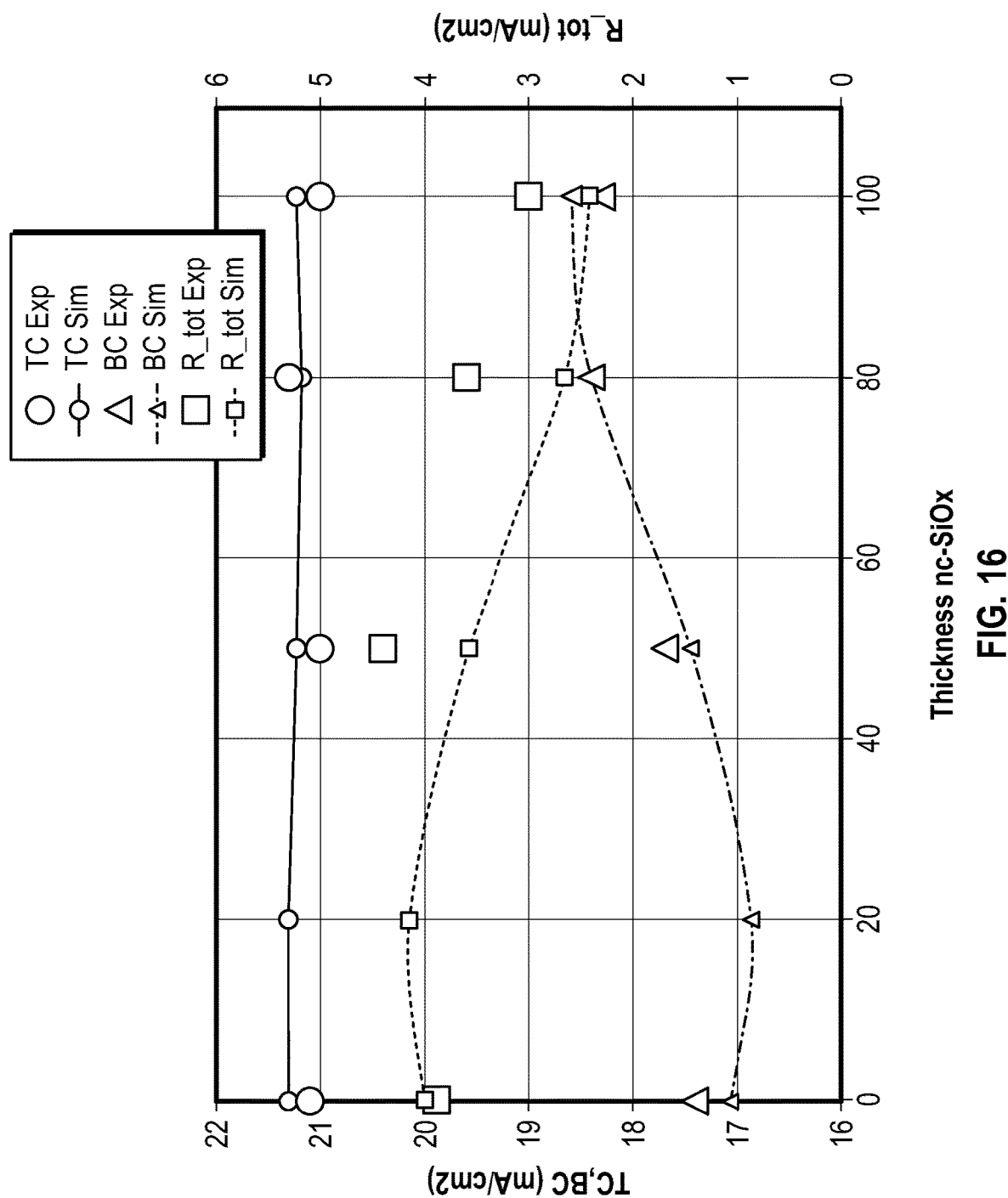
FIG. 16 illustrates the experimental and simulated current density for the top and bottom sub cells and the reflection as a function of the interlayer thickness at n=2.7 for the photovoltaic device schematically shown in FIG. 11.

FIG. 16 illustrates the experimental and simulated current density for top and bottom cells, and the total experimental reflection and total simulated reflection as a function of the interlayer thickness at n=2.7. From this it can be seen that the manipulation of the reflection losses as well as the corresponding gains in bottom cell $J_{sc}$ can be quantitatively well explained by the theoretical model. The small differences between the experiment and the simulations are most likely due to imperfect layer homogeneities resulting from the use of small lab-sale deposition methods. Thus, it can be summarized that this mechanism is completely understood and under control by the nc-SiOx interlayer.

Figure 17:
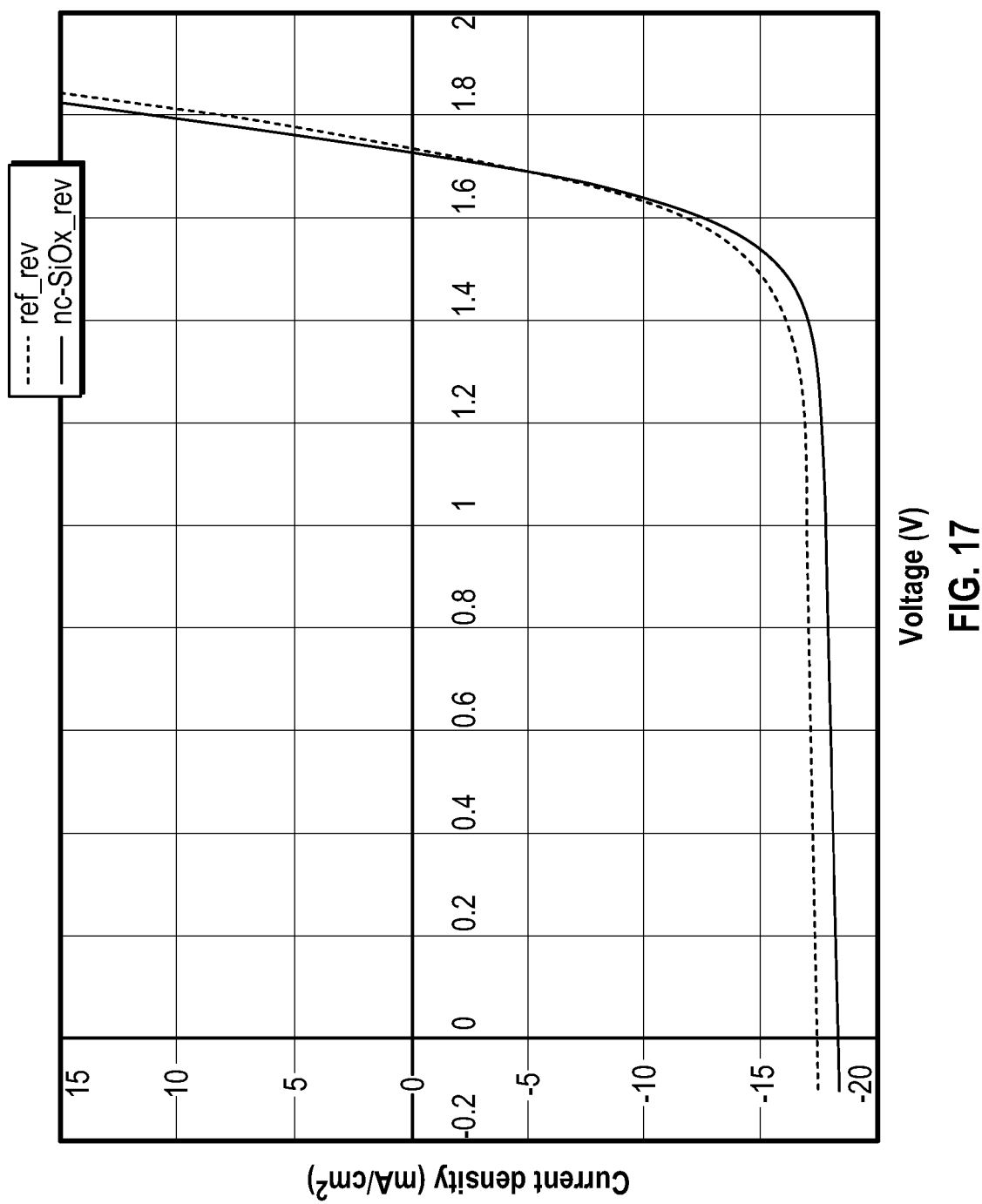
FIG. 17 illustrates light current density vs voltage (JV) curves for scans performed in the direction $J_{sc}$ to $V_{oc}$ (fwr), a $V_{oc}$ to $J_{sc}$ (rev), dark curve in the same direction as fwr and the maximum power point tracked curve (MPP), in respect of the photovoltaic device schematically shown in FIG. 11 (i.e. with an nc-SiO$_x$ interlayer), and a similar reference photovoltaic device (ref.) which does not contain an nc-SiO$_x$ interlayer.

FIG. 17 shows two representative set of JV-curves, one from the split with no nc-SiOx interlayer and one from the split with the 80 nm nc-SiOx interlayer. To obtain the current density, the IV data was scaled by the factor $J_{sc,EQE}/J_{-0.1V,\ sosim}$ to compensate the spectral mismatch of the solar simulator to the AM1.5 g norm spectrum, which overestimates the current generated in the limiting bottom cell and thus the current of the entire device. It has to be mentioned that, while this approach compensates for the mismatch and gives an accurate estimation of the $J_{sc}$, the FF of a tandem cell is also affected by the mismatch. A calibrated JV measurement therefore requires a dual zone solar irradiation, which has not been made until now. Nevertheless, we estimate the error in FF to be much smaller than the gain in $J_{sc}$ due to the interlayer that is described in the following.

FIG. 17 also shows that the maximum power point tracked curve (MPP) overlays the reverse curve. From this we infer that the reverse curve is the decisive curve for describing the device's power generation characteristics. The FF and $V_{oc}$ as obtained from the reverse curve, as well as the $J_{sc,\ EQE}$ and the product of the three, the power conversion efficiency for both of the cells are given below in Table 2.

TABLE 2

Light JV characteristics of the shown cells as obtained from the reverse scan.

| | FF (%) | $V_{oc}$ (V) | $J_{sc,\ EQE}$ (mA/cm$^2$) | PCE (%) |
|---|---|---|---|---|
| No nc-SiO$_x$: H (reference), (BT14A_B) | 75.6 | 1.74 | 17.4 | 22.9 |
| 80 nm nc-SiO$_x$: H (BT9D_B) | 76.2 | 1.73 | 18.3 | 24.1 |

It can be seen that both cells exhibit excellent electronic properties with $V_{oc}$>1.7 mV and FF>75%. In particular the rather thick interlayer of 80 nm does not adversely affect the internal contact or reduce the FF which is due to the excellent (transversal) conductivity. The relative differences in $V_{oc}$ and FF are likely to be explained by the run-to-run non-reproducibly as well as the above mentioned influence of the mismatch on the FF. In the given examples, the power conversion efficiency (PCE) is enhanced by 1.2% absolute or 5% relative.

Conclusion

As demonstrated above, gains in $J_{sc}$ in the bottom cell of a perovskite/silicon multi-junction photovoltaic device can be obtained by reducing the reflection losses in the wavelength range 750-1000 nm and this can be achieved by placing an interconnect layer with the right refractive index and thickness, comprising a two-phase material comprising elongate silicon nanocrystals embedded in a silicon oxide matrix, in between the perovskite and silicon sub cells. The monolithically integrated multi-junction photovoltaic device shown schematically in FIG. 11 in particular, produces a $J_{sc}$ that is increased by 0.9 mA/cm$^2$ and a PCE which is enhanced by 1.2% absolute.

Device Structure—Perovskite Material

In the above described multi-junction photovoltaic devices, the first sub-cell 110 comprises a photoactive region that comprises a perovskite material. The perovskite material in the photoactive region of the first sub-cell 110 is configured to function as a light absorber/a photosensitizer within the photoactive region. The perovskite material then preferably has a band gap from 1.50 eV to 1.75 eV, and more preferably from 1.65 eV to 1.70 eV. The second sub-cell comprising the silicon heterojunction (SHJ) then preferably has a band gap of around 1.1 eV.

In addition, the perovskite material in the photoactive region of the first sub-cell 110 may also be configured to provide charge transport. In this regard, perovskite materials are able to act not only a light absorber (i.e. photosensitizer) but also as an n-type, p-type or intrinsic (i-type) semiconductor material (charge transporter). A perovskite material can therefore act both as a photosensitizer and as the n-type semiconductor material. The perovskite material may therefore assume the roles both of light absorption and long range charge transport.

Preferably, the perovskite material is of general formula (I):

$$[A][B][X]_3 \quad (I)$$

wherein [A] is one or more monovalent cations, [B] is one or more divalent inorganic cations, and [X] is one or more halide anions.

[X] preferably comprises one or more halide anions selected from fluoride, chloride, bromide, and iodide, and preferably selected from chloride, bromide and iodide. More preferably [X] comprises one or more halide anions selected from bromide and iodide. In some embodiments, [X] preferably comprises two different halide anions selected from fluoride, chloride, bromide, and iodide, and preferably selected from chloride, bromide and iodide, and more preferably comprises bromide and iodide.

[A] preferably comprises one or more organic cations selected from methylammonium ($CH_3NH_3^+$), formamidinium ($HC(NH_2)_2^+$), and ethyl ammonium ($CH_3CH_2NH_3^+$), and preferably comprises one organic cation selected from methylammonium ($CH_3NH_3^+$) and formamidinium ($HC(NH_2)_2^+$). [A] may comprise one or more inorganic cations selected from Cs+, Rb+, Cu+, Pd+, Pt+, Ag+, Au+, Rh+, and Ru+.

[B] preferably comprises at least one divalent inorganic cation selected from $Pb^{2+}$ and $Sn^{2+}$, and preferably comprises $Pb^{2+}$.

In preferred embodiments, the perovskite material has the general formula:

$$A_xA'_{1-x}B(X_yX'_{1-y})_3 \quad (IA)$$

wherein A is selected from methylammonium (MA) and formamidinium (FA), A' is selected from formamidinium (FA) and a caesium cation ($Cs^+$), B is selected from $Pb^{2+}$ and $Sn^{2+}$, X is iodide and X' is bromide, and wherein $0<x\leq1$ and $0<y\leq1$. In these preferred embodiments, the perovskite material can therefore comprise a single monovalent cation or a mixture of two monovalent cations. In addition, in the preferred embodiments, the perovskite material can therefore comprise either a single iodide anion or a mixture of iodide and bromide anions. The present inventors have found such perovskite materials can have band gaps in from 1.50 eV to 1.75 eV and that layers of such perovskite materials can be readily formed with suitable crystalline morphologies and phases. More preferably, the perovskite material is selected from $MAPb(I_{0.8}Br_{0.2})_3$, $FA_{0.5}MA_{0.5}PbI_3$, $FAPbI_3$, and $FA_{1-x}Cs_xPbI_{3-y}Br_y$.

In order to provide highly efficient photovoltaic devices, the absorption of the absorber should ideally be maximised so as to generate an optimal amount of current. Consequently, when using a perovskite as the absorber in a photovoltaic device or sub-cell, the thickness of the perovskite layer should ideally be in the order of from 300 to 600 nm, in order to absorb most of the sun light across the visible spectrum. Typically, therefore, the thickness of the layer of the perovskite material is greater than 100 nm. The thickness of the layer of the perovskite material in the photovoltaic device may for instance be from 100 nm to 1000 nm. The thickness of the layer of the perovskite material in the photovoltaic device may for instance be from 200 nm to 700 nm, and is preferably from 300 nm to 600 nm. In the above described multi-junction photovoltaic devices, the planar layer of perovskite material 113 in the photoactive region of the first/top sub-cell 110 preferably has a thickness from 350 nm to 450 nm, and more preferably of approximately 400 nm.

Two-Phase Material—Formation

The two-phase material comprising elongate (i.e. filament like) silicon nanocrystals (nc-Si:H) 131a embedded in a silicon oxide matrix 131b materials can be fabricated by plasma-enhanced chemical vapor deposition (PECVD) from silane ($SiH_4$), carbon dioxide ($CO_2$) and hydrogen ($H_2$) precursor gases. Previous work has found that the ratio of the $CO_2/SiH_4$ is the main parameter that determines the proportion of oxygen in the film, and thereby determines the refractive index. However, the dilution of $H_2$ in the plasma then also facilitates the incorporation of oxygen into SiOx. It this gives a two-way control of oxygen incorporation that allows control of the phase separation of the two-phase material. Specifically, previous work has shown that layers produced with low $H_2$ dilution show no phase separation, whilst strong phase separation and the formation of elongate silicon nanocrystals within the silicon oxide matrix occurs at the highest $H_2$ dilutions.

Research has shown that atomic hydrogen from the plasma increases the structural order of the growing film via relaxation of strained bonds and increase of adatom diffusion length through surface heating and passivation of surface dangling bonds. Increasing $H_2$ dilution thereby enables the phase separation through increased adatom mobility. It is then energetically favourable for the silicon nanocrystal phase to form by continued growth of initially nucleated particles to produce elongate (i.e. filament like) silicon nanocrystals that grow substantially perpendicularly to the substrate.

Some Advantages of the Two-Phase Material

Due to the heterogeneous nanostructure and the resulting anisotropic transport properties, the nc-SiOx:H layer reduces the negative influence of shunts. Shunt paths that are existing in the perovskite absorber layer (e.g. resulting from pinholes or particles present on the surface during layer deposition) have only limited detrimental influence due to the low lateral conductivity of the absorber layer. However, if a highly conductive layer such as ITO electronically connects these shunts to the rest of the cell, the conversion efficiency can drop significantly. Due to its distinct nanostructure, nc-SiOx:H has a lateral conductivity, which (depending on stoichiometry and nanostructure) can be several orders of magnitude lower than the transversal conductivity. Thus, using such layer, a low-ohmic tunnel recombination contact can be realized due to the high transversal conductivity. Due to the low lateral conductivity, the detrimental influence of shunt paths can be reduced.

As described above, nc-SiOx:H is typically synthesized within a plasma enhanced chemical vapor deposition (PECVD) reactor. This allows combined deposition with the standard passivation and emitter layer stack common in silicon heterojunction solar cells (although this layer is also applicable for diffused (homojunction) silicon solar cells). Furthermore, PECVD allows the convenient grading of layer properties as well as the controlled, homogenous deposition of very thin functional layers, which improve the tunnel contact.

It will be appreciated that individual items described above may be used on their own or in combination with other items shown in the drawings or described in the description and that items mentioned in the same passage as each other or the same drawing as each other need not be used in combination with each other.

Furthermore, although the invention has been described in terms of preferred embodiments as set forth above, it should be understood that these embodiments are illustrative only. Those skilled in the art will be able to make modifications and alternatives in view of the disclosure which are contemplated as falling within the scope of the appended claims.

For example, those skilled in the art will appreciate that whilst the illustrated embodiments of the invention all relate to photovoltaic devices having a multi-junction structure in which the top perovskite sub-cell is illustrated as having a planar heterojunction arrangement, wherein the a compact layer of perovskite is provided between layers of p-type and n-type materials that do not have open porosity, the interconnect layers described herein are equally applicable to multi-junction photovoltaic devices in which the top perovskite sub-cell has other configurations. For example, the top perovskite sub-cell could comprise a porous scaffold of semiconducting or dielectric material on which the perovskite material is provided as either a thin layer or as a capping layer. By way of further example, the top perovskite sub-cell could comprise only one charge transporting region, as it has been shown that functional photovoltaic devices comprising a photoactive perovskite can be formed without any hole-transporting materials.

The invention claimed is:

1. A multi junction photovoltaic device comprising:
   a first photovoltaic sub-cell comprising a photoactive region comprising a layer of perovskite material;
   a second photovoltaic sub-cell comprising a photoactive silicon absorber; and
   an intermediate region disposed between and connecting the first photovoltaic sub-cell and the second photovoltaic sub-cell;
   wherein the intermediate region comprises an interconnect layer, the interconnect layer comprising a two-phase material comprising elongate silicon nanocrystals embedded in a silicon oxide matrix; wherein the elongate silicon nanocrystals are doped, with either n-type or p-type doping,
   wherein the first and second photovoltaic sub-cells comprise opposing surfaces facing each other, and a longitudinal axis of the elongate silicon nanocrystals is substantially perpendicular to the opposing surfaces of the first photovoltaic sub-cell and the second photovoltaic sub-cell, and
   wherein the multi junction photovoltaic device is monolithically integrated.

2. The multi junction photovoltaic device of claim 1, wherein the silicon oxide matrix comprises amorphous hydrogenated silicon oxide.

3. The multi junction photovoltaic device of claim 1, wherein the silicon oxide matrix has an oxygen fraction from 10 to 50%.

4. The multi junction photovoltaic device of claim 1, wherein the two-phase material comprises from 10 to 50% silicon nanocrystals by volume.

5. The multi junction photovoltaic device of claim 1, wherein a lateral conductivity of the interconnect layer is two or more orders of magnitude lower than a transversal conductivity of the interconnect layer.

6. The multi junction photovoltaic device of claim 1, wherein the interconnect layer has a refractive index (n) in the range 2.70 to 2.90.

7. The multi junction photovoltaic device of claim 1, wherein the intermediate region comprises one or more further layers.

8. The multi junction photovoltaic device of claim 1, wherein the intermediate region further comprises a layer of transparent conducting oxide (TCO); wherein the layer of transparent conducting oxide (TCO) is disposed between the interconnect layer and the first photovoltaic sub-cell.

9. The multi junction photovoltaic device of claim 1, wherein the intermediate region further comprises a recombination layer.

10. The multi junction photovoltaic device of claim 1, wherein the intermediate region further comprises a further interconnect layer comprising a two-phase material comprising silicon nanocrystals embedded in a silicon oxide matrix.

11. The multi junction photovoltaic device of claim 1, wherein the first photovoltaic sub-cell comprises a p-type region, an n-type region, and the photoactive region is disposed between the p-type region and the n-type region; wherein the first photovoltaic sub-cell is arranged such that the n-type region is adjacent to the second photovoltaic sub-cell.

12. The multi junction photovoltaic device of claim 1, wherein the first photovoltaic sub-cell comprises a p-type region, an n-type region, and the photoactive region is disposed between the p-type region and the n-type region; wherein the first photovoltaic sub-cell has an inverted structure; wherein the first photovoltaic sub-cell is arranged such that the p-type region is adjacent to the second photovoltaic sub-cell.

13. The multi junction photovoltaic device according to claim 1, wherein the first photovoltaic sub-cell comprises a layer of perovskite material of general formula (I):

$$[A][B][X]_3 \qquad (I)$$

wherein [A] is one or more monovalent cations, [B] is one or more divalent inorganic cations, and [X] is one or more halide anions.

14. The multi junction photovoltaic device according to claim 13, wherein the perovskite material is of general formula (IA):

$$A_xA'_{1-x}B(X_yX'_{1-y})_3 \qquad (IA)$$

wherein A is selected from methylammonium (MA) and formamidinium (FA), A' is selected from formamidinium (FA) and a caesium cation (Cs$^+$), B is selected from Pb$^{2+}$ and Sn$^{2+}$, X is iodide and X' is bromide, and wherein $0<x\leq1$ and $0<y\leq1$.

15. The multi junction photovoltaic device of claim 9, wherein the recombination layer is disposed between the interconnect layer and the second photovoltaic sub-cell; or wherein the recombination layer is disposed between the interconnect layer and the first photovoltaic sub-cell.

16. The multi junction photovoltaic device of claim 15, wherein the recombination layer comprises n-doped nanocrystalline silicon.

17. The multi junction photovoltaic device of claim 10, wherein one of the interconnect layer and the further interconnect layer comprises n-doped elongate silicon nanocrystals and the other of the interconnect layer and the further interconnect layer comprises p-doped elongate silicon nanocrystals.

* * * * *